(12) United States Patent
King

(10) Patent No.: US 8,760,180 B1
(45) Date of Patent: *Jun. 24, 2014

(54) SYSTEMS AND METHODS MITIGATING TEMPERATURE DEPENDENCE OF CIRCUITRY IN ELECTRONIC DEVICES

(71) Applicant: Jeffrey Allen King, San Diego, CA (US)

(72) Inventor: Jeffrey Allen King, San Diego, CA (US)

(73) Assignee: Analog Test Engines, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/953,689

(22) Filed: Jul. 29, 2013

(51) Int. Cl.
*G01R 31/00* (2006.01)

(52) U.S. Cl.
USPC ...... 324/750.02; 324/601; 324/105; 327/513; 702/99

(58) Field of Classification Search
USPC .......... 324/750.01–750.03, 601, 105; 702/99; 327/512; 323/313
See application file for complete search history.

(56) References Cited

U.S. PATENT DOCUMENTS

| | | | | |
|---|---|---|---|---|
| 6,275,422 B1* | 8/2001 | Javanifard et al. | ........ | 365/189.07 |
| 6,640,323 B2* | 10/2003 | Akram | .......... | 714/724 |
| 7,272,523 B1* | 9/2007 | John et al. | ........ | 702/85 |
| 7,433,790 B2* | 10/2008 | Anderson et al. | ........... | 702/85 |
| 8,390,363 B2* | 3/2013 | Engl | ............ | 327/512 |
| 8,531,235 B1* | 9/2013 | Zonte | ............ | 327/512 |
| 2005/0030000 A1* | 2/2005 | Hayashimoto | ............ | 323/313 |

* cited by examiner

*Primary Examiner* — Huy Q Phan
*Assistant Examiner* — James Split

(57) ABSTRACT

Methods and systems for compensating for temperature variation in the performance of electronic circuits and systems are disclosed. In some embodiments, the systems are configured to store compensation parameters determined in calibration, where the compensation parameters are used by the systems to modify performance. In some embodiments, the systems are part of an automatic test equipment (ATE) system.

12 Claims, 19 Drawing Sheets

SYSTEMS AND METHODS MITIGATING TEMPERATURE DEPENDENCE OF CIRCUITRY IN ELECTRONIC DEVICES

BACKGROUND

1. Field

The described technology relates to systems and methods of compensating for performance variation of electronic circuits caused by temperature changes.

2. Description of the Related Technology

Automatic Test Equipment (ATE) is a computer based system that tests a device, known as a Device Under Test (DUT). The ATE can be programmed to provide power signals, reference signals, and input signals to the DUT. The ATE can also be programmed to receive signals, such as voltages and currents, generated by the DUT in response to the input from the ATE. The ATE can compare the received signals with predetermined values to determine whether the DUT is operating according to specifications. Testing and diagnosing faults with ATE can be performed on wafer die, packaged electronic parts, or electronic systems.

In order for the ATE to generate signals for the DUT and to receive and compare signals from the DUT, the ATE extensively uses reference voltages. The reference voltages are generally internal to the ATE and are used by the circuitry of the ATE to generate reference signals and input signals for the DUT, and to receive and compare output signals from the DUT. Accordingly, accurate reference voltages are very important to the proper function of the ATE.

In general, the circuitry of the ATE and the circuitry used to generate the reference voltages have performance which is sensitive to temperature. This may be especially problematic because the temperature within the ATE can vary dramatically with, for example, changing ambient conditions and changing power used in various components of the ATE which change during its operation. Accordingly, voltages, currents, propagation delays, and other circuit parameter values change during the operation of the ATE. The temperature dependence of ATE performance can be a dominant source of ATE inaccuracy.

SUMMARY OF CERTAIN INVENTIVE ASPECTS

Certain inventive aspects include methods and systems for compensating for temperature variation in the performance of electronic circuits, such as those used in Automatic Test Equipment (ATE) systems. In some embodiments, the systems are configured to store compensation parameters determined in calibration, where the compensation parameters are used by the systems to modify performance of a reference generator, such as a bandgap reference generator.

DETAILED DESCRIPTION OF CERTAIN INVENTIVE EMBODIMENTS

Various aspects and features of methods and devices are described herein with reference to the accompanying drawings, which show certain embodiments. The described embodiments may be modified in various ways, without departing from the spirit or scope of the present invention or inventions. In addition, the described embodiments have multiple features and aspects, no single one of which is solely responsible for the desirable characteristics of the embodiments. Furthermore, no single feature or aspect is essential to practicing the methods and systems described herein. Additionally, various features and aspects of the embodiments may be combined in embodiments not specifically described. For example, one or more features described with reference to one embodiment may be combined with one or more features described with reference to another embodiment.

Various inventive aspects of certain embodiments of systems and methods mitigating temperature dependence in electronic circuits are discussed. The aspects, which are discussed herein in the context of ATE devices, may be applied to other electronic devices as well. In some embodiments, the systems and methods provide reference voltages which compensate for variations in temperature dependencies of the ATE circuitry and reference voltage generation circuitry.

Figure 1:
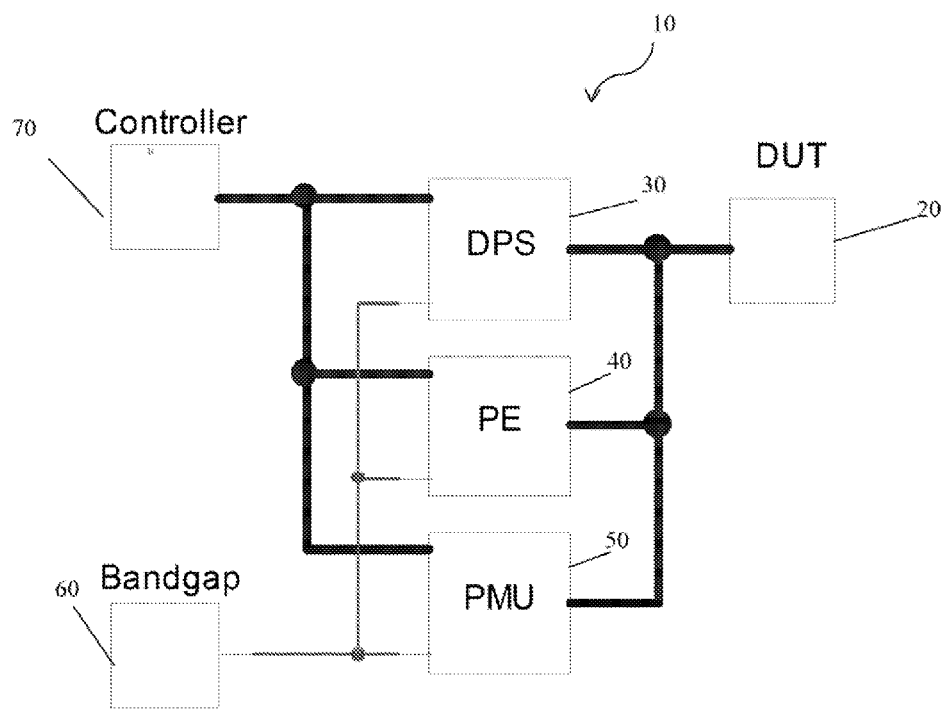
FIG. 1 is a block diagram schematic view of an embodiment of an ATE system.

FIG. 1 is a block diagram schematic view of an embodiment of an ATE system 10. The various aspects discussed herein in may be applied to other ATE systems and other electronic devices. The ATE system 10 of this embodiment is connected to a device under test (DUT) 20 to be tested, and includes a DUT power supply (DPS) 30, pin electronics (PE) 40, a parametric measurement unit (PMU) 50, a bandgap reference generator 60, and a controller 70.

The controller 70 is programmable, and is configured to provide signals to each of the DPS 30, the PE 40, and the PMU 50 to control the operation thereof. The controller 70 may be programmed so as to cause the ATE system 10 to provide power and input stimulus to the DUT 20, to receive electrical responses from the DUT 20, and to compare the DUT responses with programmed expected values, or test limits. Based on the comparisons, the ATE system 10 may determine whether the DUT 20 functions according to design specifications.

The DPS 30 is configured to provide, for example, power supply voltages to the DUT 20. The DPS 30 may also be configured to supply reference voltages and reference currents to the DUT 20. The values of the power supply and reference voltages and currents may be based on input received from the controller 70.

The PE 40 is configured to provide digital signals to the DUT 20. For example, the PE 40 may include or may be connected to a pattern memory, which stores digital data representing signals for the DUT 20. Based on signals from the controller 70, the PE 40 accesses data from the pattern memory, and provides digital signals to the DUT 20 corresponding with the digital data in the pattern memory. The timing characteristics of the digital signals, for example, the frequency or the duration of the digital signals may be determined based on signals from the controller 70 and the data in the pattern memory.

In this embodiment, the PE 40 is also configured to receive digital signals from the DUT 20. For example, the PE 40 may include or may be connected to a DUT output memory, which stores data representing signals from the DUT 20. Based on signals from the controller 70, the PE records signals from the DUT 20, and provides data to the output memory representing the recorded signals. The timing characteristics of the recorded data, for example, time points when the data is recorded, may be determined based on signals from the controller 70.

The PMU 50 is configured to determine values of, for example, voltages and currents output from the DUT 20. Accordingly, the PMU 50 may include or may be connected to one or more analog to digital converters, which are configured to receive a voltage or a current from the DUT 20 and to generate a digital value representing the voltage or current. The digital value may then be stored in the DUT output memory. The timing characteristics of the measurements, for example, time points when the measurements are taken, may be determined based on signals from the controller 70.

The DPS 30, the PE 40, and the PMU 50 include numerous circuits which each use one or more reference voltages or currents to provide accurate and precise performance. In this example, the reference voltages are generated based on one or more voltages generated by bandgap reference generator 60. In some embodiments, a voltage generator other than a bandgap reference generator may be used. [Note: Please list any other reference generators.]

Figure 2:
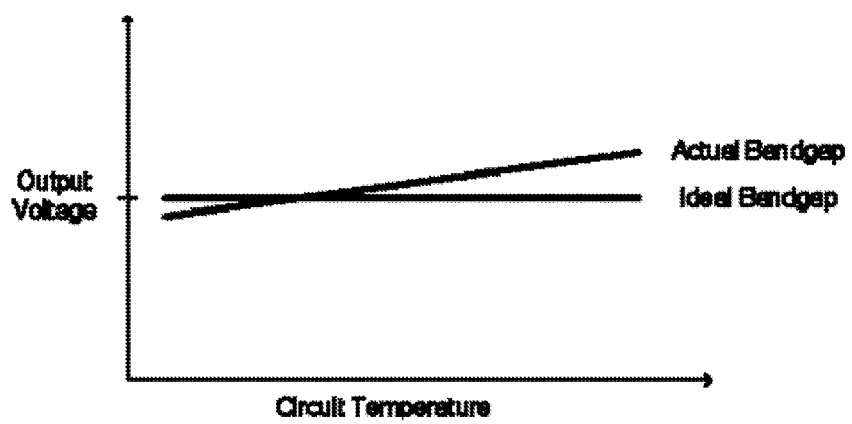
FIG. 2 is a graph showing output voltage of actual and ideal bandgap circuits.

As discussed above, although reference generators may be designed to minimize temperature dependence, at least because of variations in manufacturing processes and simulation modeling errors, the reference voltages or currents also have a nonzero temperature dependence. This is illustrated in FIG. 2, which is a graph showing output voltage of actual and ideal bandgap circuits. Accordingly, the performance of the ATE system 10 is dependent on temperature at least because of the nonzero temperature dependence of the reference generator.

Figure 3:
FIG. 3 is a block diagram of a reference generator connected with a control register.

FIG. 3 is a block diagram of a reference generator 100 connected with control register 110. In this embodiment, the reference generator 100 is configured to generate reference voltages and/or currents based on input from the control register 110. Each of the possible input values from the control register 110 corresponds with a different temperature dependence of the reference voltage or current from the reference generator 100.

Figure 4:
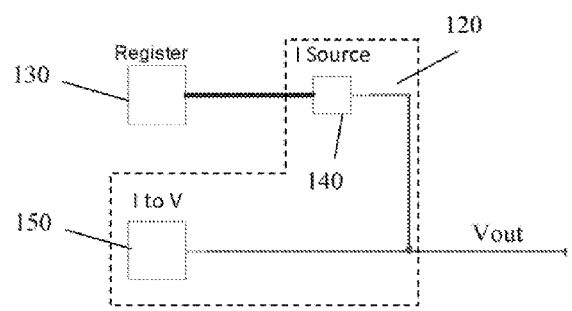
FIG. 4 is a schematic diagram of an embodiment of a reference generator which is configured to receive a signal from a register.

FIG. 4 is a schematic diagram of an embodiment of a reference generator 120 which is configured to receive a signal from a register 130. In this example, reference generator 120 is configured to generate a reference voltage at output node Vout. The reference voltage has a temperature dependence which may be modified by changing the signal from the register 130. The reference generator 120 is an example only, and other generators may be used.

In this embodiment, reference generator 120 includes programmable current source 140 and current to voltage converter 150. Current source 140 is configured to provide a current to converter 150, which generates a voltage output based on the current.

Current source 140 is configured to generate the current with a temperature dependence. For example, current source 140 may include a current generator (not shown) which has one or more bipolar transistors and one or more resistors. An increase in temperature causes the current generator to produce less current. The current provided to converter 150 may be mirrored from the current of the current generator using a current mirror having a reference device and a number of output devices. As a result, the current provided to the converter 150 is the current of the current generator multiplied by a factor determined by the relative size of the reference device and the number and size of the output devices. Similar configurations may be found in conventional bandgap reference voltage generators.

The current provided to converter 150 is also based on the signal from register 130. For example, the current source 140 may include an input unit configured to receive the signal from the register 130. The amount of mirrored current may be dependent on the signal. In some embodiments, the number of output devices of the current mirror is controlled by the signal.

As a result, in such embodiments, the current provided to converter 150 is equal to the current of the temperature dependent current generator multiplied by a factor determined by the signal from the register 130. Thus, the temperature dependence (or the change in the current for a change in temperature) of the current provided to converter 150 is based on the current generator of current source 140 and on the signal from the register.

The current to voltage converter 150 includes an output unit configured to generate a voltage based on the current received from current source 140. The magnitude of the voltage generated for a fixed received current is dependent partly on temperature. For example, converter 150 may include a resistor having a resistance which is dependent on temperature such that an increase in temperature causes the resistance to increase.

As a result, in such embodiments, the voltage generated by reference generator 120 is based on the temperature dependence of the resistor of the current to voltage converter 150, on the temperature dependence of the current generator of current source 140, and on the signal from the register 130. Also, because the effect of the temperature dependence of the current generator of current source 140 on the output voltage of reference generator 120 is based on the signal from the register 130, the signal from register 130 affects the temperature dependence of the output voltage of reference generator 120.

In some embodiments, other architectures are used. For example, instead of or in addition to the number of output devices of the current minor being controlled by the signal of register 130, the resistance of the resistor of current to voltage converter 150 may be controlled by the signal of register 130. This may be accomplished, for example, by a circuit configured to selectively switch in resistors according to the signal of register 130. Other programmable voltage reference generators may alternatively be used.

Figure 5:
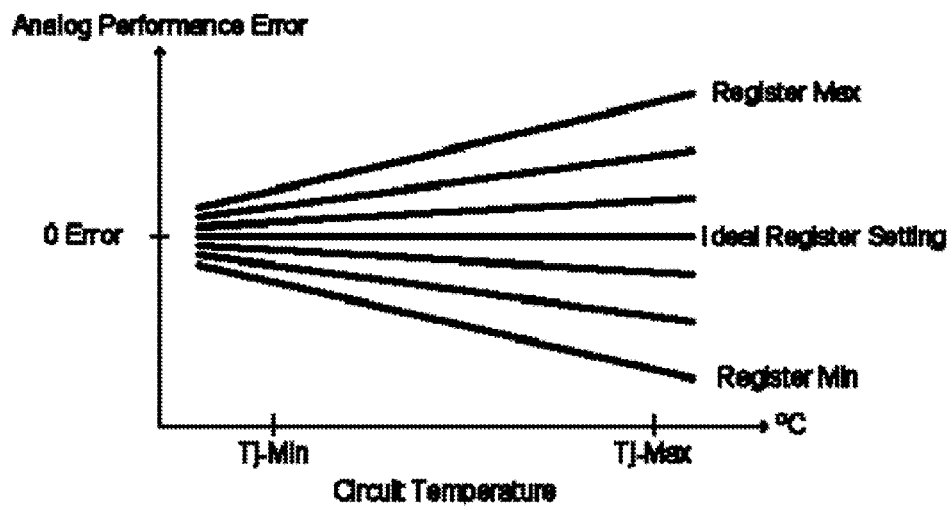
FIG. 5 is a graph showing temperature dependence of the reference voltage generated by a reference generator for various signal values from the register.

FIG. 5 is a graph showing temperature dependence of the reference voltage generated by reference generator 120 for various signal values from the register. As shown in FIG. 5, certain register values result in a reference voltage which increases with an increase in temperature. In addition, certain other register values result in a reference voltage which decreases with an increase in temperature. An ideal register setting results in a reference voltage which neither increases nor decreases with an increase in temperature.

Figure 6:
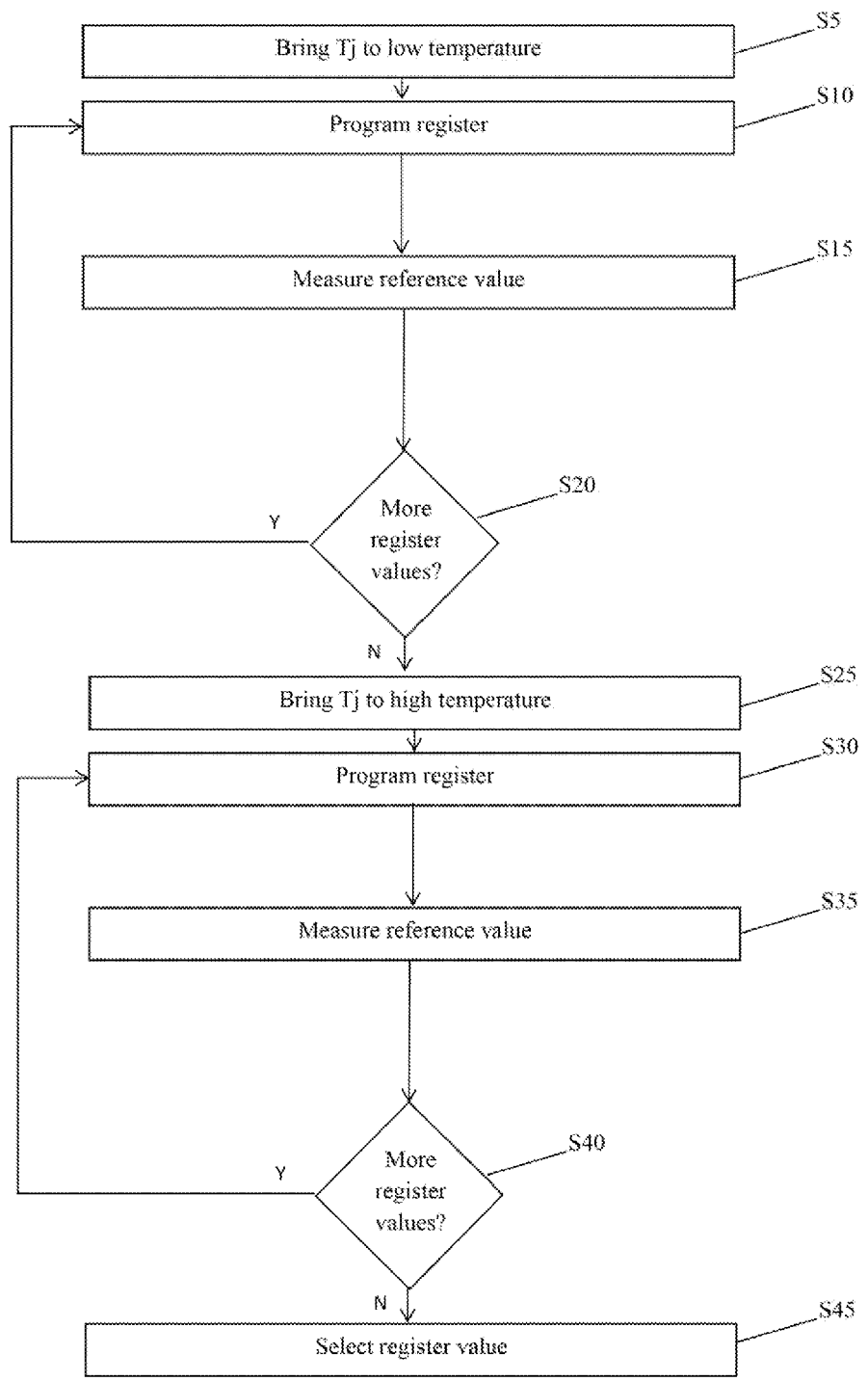
FIG. 6 is a flowchart diagram illustrating an embodiment of a method of calibrating a reference generator receiving an input value from a register to modify a reference output.

FIG. 6 is a flowchart diagram illustrating an embodiment of a method of calibrating a reference generator receiving an input value from a register to modify a reference output. Other methods may alternatively be used.

At S5, the temperature of the reference generator and surrounding circuitry is brought to a low value. For example, the junction temperature of the reference generator may be brought to 0 C, −20 C, or −40 C. Other temperature values may be used.

At S10, the register is programmed with a value. In response to the register being programmed, the reference generator receives a signal corresponding with the programmed value.

In response to the reference generator receiving the signal, the reference generator generates a reference value based on the temperature and on the seed signal. At S15, the reference value is measured and stored.

At S20, a determination is made as to whether additional values are to be programmed in the register. If additional values are to be programmed in the register, the method returns to S10. If additional values are not to be programmed in the register, at S25, the temperature of the reference generator and surrounding circuitry is brought to a high value. For example, the junction temperature of the reference generator may be brought to 100 C, 120 C, 140 C, or 160 C. Other temperature values may be used.

At S30, the register is programmed with a value. In response to the register being programmed, the reference generator receives a signal corresponding with the programmed value.

In response to the reference generator receiving the signal, the reference generator generates a reference value based on the temperature and on the received signal. At S35, the reference value is measured and stored.

At S40, a determination is made as to whether additional values are to be programmed in the register. If additional values are to be programmed in the register, the method returns to S30. If additional values are not to be programmed in the register, at S45, a register value is selected.

To select a register value, the temperature dependence of the reference values associated with each register value may be determined by calculating a difference between the generated reference values for each register value at two or more temperatures. The temperature dependences resulting from the various register values are compared, and the register value resulting in a minimum reference value temperature dependence may be selected.

Alternative methods may be used for calibrating the reference generator and associated register. For example, a binary search algorithm may be used.

Figure 7:
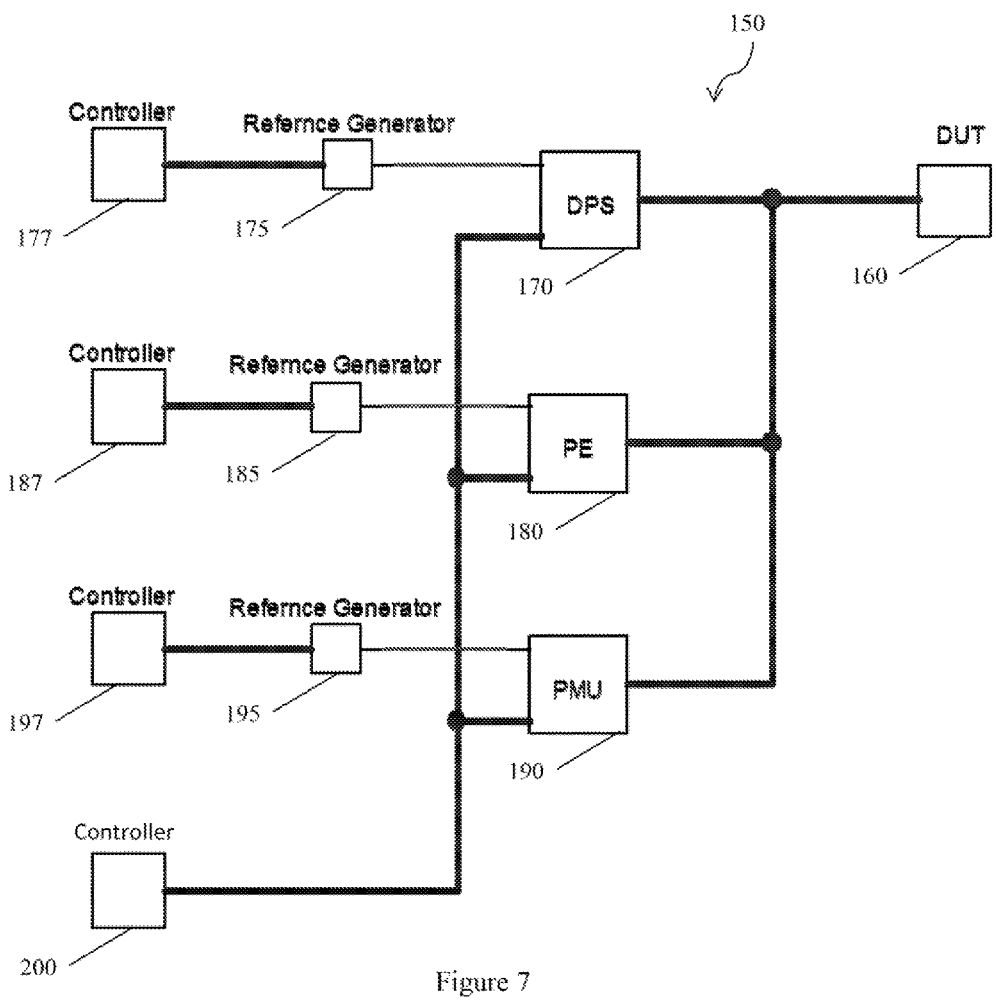
FIG. 7 is a block diagram schematic view of an embodiment of an ATE system.

FIG. 7 is a block diagram schematic view of an embodiment of an ATE system 150. The various aspects discussed herein in may be applied to other ATE systems and other electronic devices. The ATE system 150 of this embodiment is connected to a device under test (DUT) 160 to be tested, and includes a DUT power supply (DPS) 170, pin electronics (PE) 180, a parametric measurement unit (PMU) 190, and a controller 200. The ATE system 150 also includes a reference generator for each of the DPS 170, the PE 180, and the PMU 190; and a controller for each of the reference generators. Accordingly, the ATE system 150 includes a reference generator 175 for DPS 170, and a controller 177 for reference generator 175. The ATE system 150 also includes a reference generator 185 for PE 180, and a controller 187 for reference generator 185. In addition, the ATE system 150 includes reference generator 195 for PMU 190, and controller 197 for reference generator 195

The controller 200 is programmable, and is configured to provide signals to each of the DPS 170, the PE 180, and the PMU 190 to control the operation thereof. In some embodiments, the controller 200 functions similar to the operation of controller 70 with respect to DPS 30, PE 40, and PMU 50 as described above with reference to FIG. 1. Likewise, DPS 170, PE 180, and PMU 190 may respectively function similar to the operation of DPS 30, PE, and PMU 50 as described above.

The DPS 170, the PE 180, and the PMU 190 each include numerous circuits which each use one or more reference voltages to function with accurate and precise performance. In this example, the reference voltages are generated based on one or more voltages generated by the respective reference generators 175, 185, and 195.

As discussed above, although reference generators may be designed to minimize temperature dependence, at least because of variations in manufacturing processes and simulation modeling errors, the reference voltages have a nonzero temperature dependence. In addition, each of the circuits within ATE system 150 similarly functions with a nonzero temperature dependence. Accordingly, the outputs generated by each of the DPS 170, the PE 180, and the PMU 190 vary with temperature at least because of the temperature dependence of the DPS 170, the PE 18, and the PMU 190 themselves, and also because of the temperature dependence of the respective reference generators 175, 185, and 195.

In some embodiments, each of the reference generators 175, 185, and 195 may be controlled using their respective controllers 177, 187, and 197 in a way similar to that described above with respect to reference generator 100 and control register 110 of FIG. 3. In such embodiments, each of the reference generators 175, 185, and 195 generate reference voltages which have minimal temperature dependence.

Alternatively, each of the reference generators 175, 185, and 195 may be controlled with their respective controllers 177, 187, and 197 so as to minimize the temperature dependence in the output of the circuit for which the reference voltages of each of the reference generators 175, 185, and 195 are used. Accordingly, in the example ATE system 150, reference generator 175 may be controlled with controller 177 so as to minimize the temperature dependence in the output of DPS 170. Likewise, reference generator 185 may be controlled with controller 187 so as to minimize the temperature dependence in the output of PE 180, and reference generator 195 may be controlled with controller 197 so as to minimize the temperature dependence in the output of PMU 190.

Figure 8:
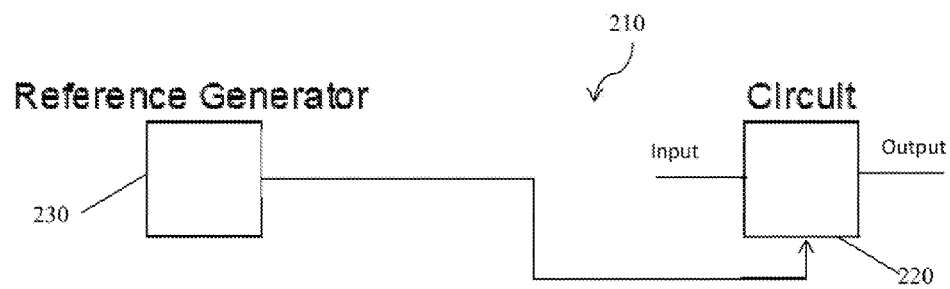
FIG. 8 is a block diagram of a system which includes a circuit which operates according to a reference voltage generated by a reference generator.

FIG. 8 is a block diagram of a system 210 which includes a circuit 220 which operates according to a reference voltage generated by reference generator 230. In this example, reference generator 230 includes an internal programmable control register having functionality similar to controllers 177, 187, and 197 discussed above with reference to FIG. 7. In addition to operating according to the reference voltage generated by reference generator 230, the circuit 220 generates an output based on an input. Accordingly, the circuit 220 generates an output based on an input and based on the reference voltage generated by reference generator 230. Furthermore, because the reference voltage generated by reference generator 230 is dependent on a value programmed in the internal control register of reference generator 230, the circuit 220 generates an output having at least one parameter which is based on the input and based on the programmed value.

To facilitate this operation, circuit 220 includes an input unit configured to receive a reference signal, and an output unit configured to generate an output, where at least one parameter of the output is dependent at least in part on the reference voltage and is controllably dependent on a temperature. For example, a change in the parameter in response to a change in the temperature is based partly on the reference signal.

Figure 9A:
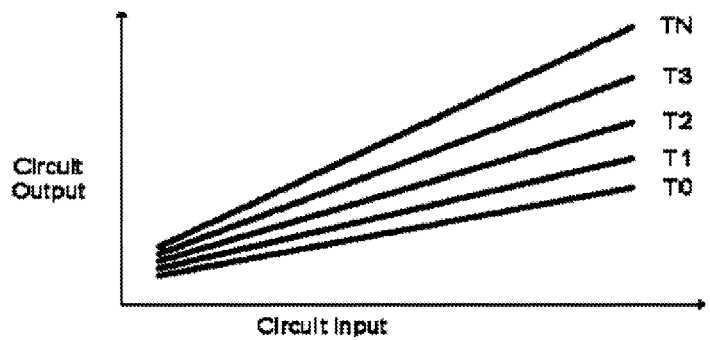
FIGS. 9A-9C illustrate graphs showing the input/output characteristics of circuit for various temperatures T0-TN, where the internal control register of reference generator is programmed with a different values.
Figure 9B:
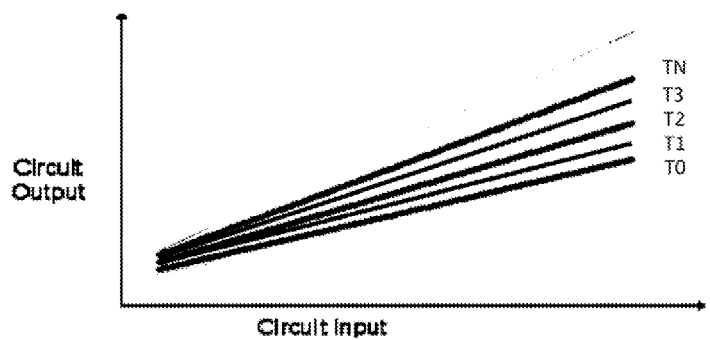
Figure 9C:
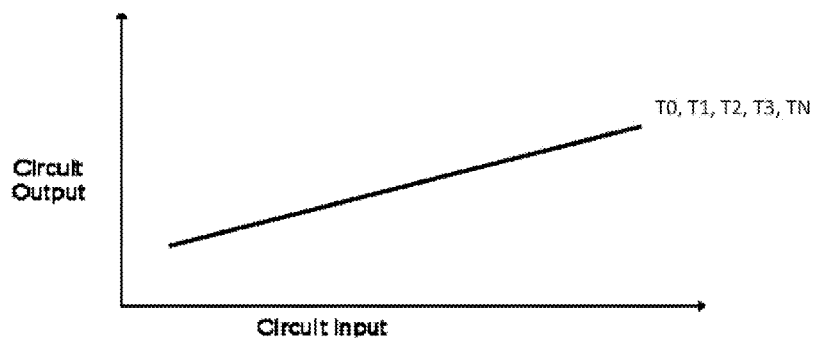

FIG. 9A illustrates a graph showing the input/output characteristics of circuit 220 for various temperatures T0-TN, where the internal control register of reference generator 230 is programmed with a first value. As shown, the input/output characteristics of circuit 220 vary significantly with temperature. FIG. 9B illustrates a graph showing the input/output characteristics of circuit 220 for the temperatures T0-TN, where the internal control register of reference generator 230 is programmed with a second value. As shown, the input/output characteristics of circuit 220 vary less with temperature when the reference generator 230 is programmed with the second value than with the first value. FIG. 9C illustrates a graph showing the input/output characteristics of circuit 220 for the temperatures T0-TN, where the internal control register of reference generator 230 is programmed with a third value. As shown, the input/output characteristics of circuit 220 do not significantly vary with temperature when the reference generator 230 is programmed with the third value.

Similar to that discussed above with reference to the reference generator of FIG. 4, the temperature dependence of the reference voltage of reference generator 230 is dependent on the programmed value. Accordingly, the temperature dependence of the reference voltage generated by reference generator 230 is different for each of the first, the second, and the third programmed values.

To facilitate this operation, reference generator 230 includes an input unit configured to receive a programmed value, and an output unit configured to generate the reference voltage for the circuit 220. As discussed above, the reference voltage is dependent at least in part on the temperature, and the temperature dependence of the reference signal is based at least in part on the programmed value.

Figure 10:
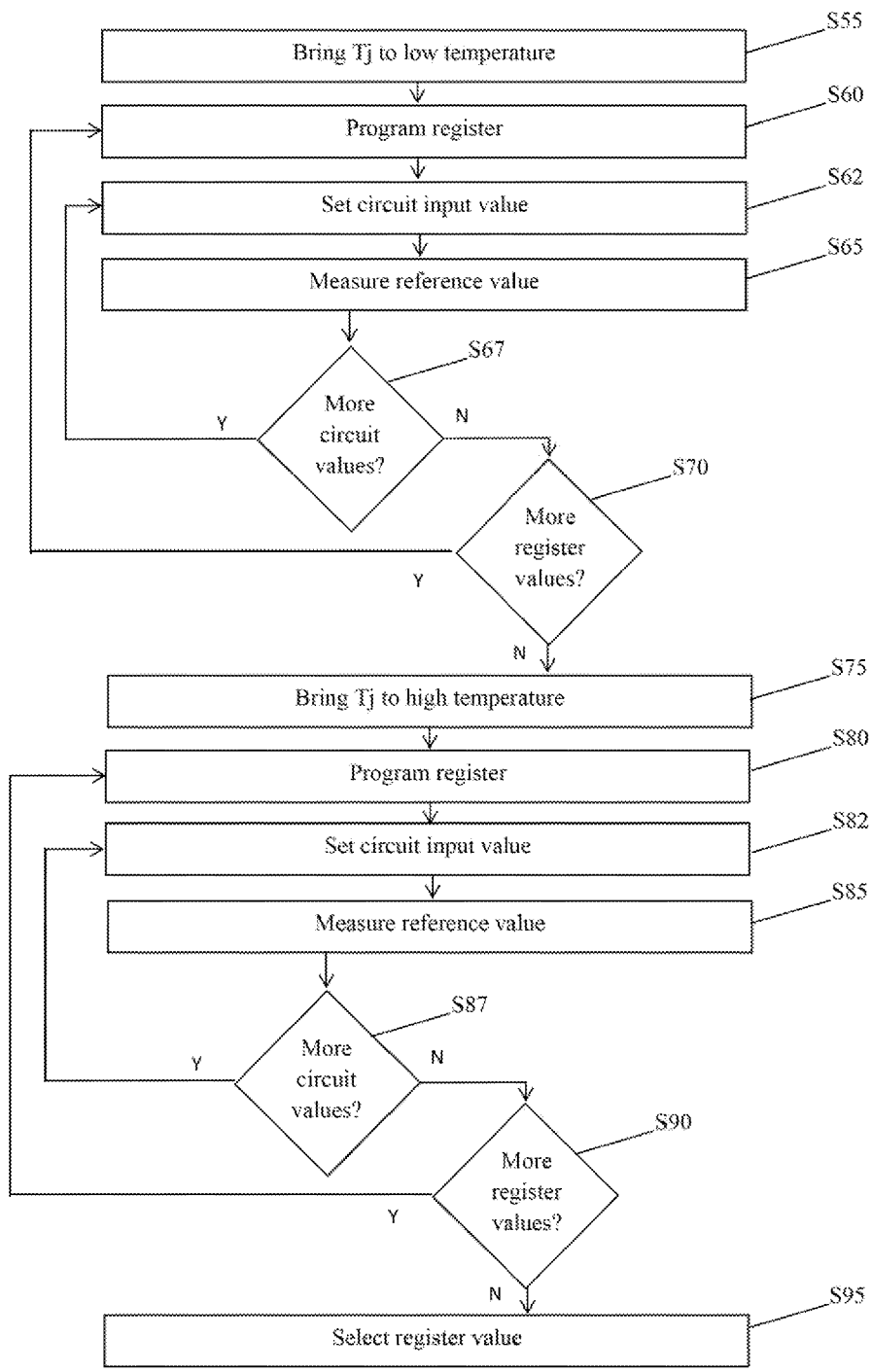
FIG. 10 is a flowchart diagram illustrating an embodiment of a method of calibrating a reference generator receiving an input value from a register to modify a reference signal.

FIG. 10 is a flowchart diagram illustrating an embodiment of a method of calibrating a reference generator receiving an input value from a register to modify a reference signal, where the reference signal is used by a circuit configured to generate an output based on an input and based on the reference signal. The reference generator and the circuit may have characteristics of reference generators and circuits described elsewhere herein. Other methods of calibration may alternatively be used.

At S55, the temperature of the reference generator and the circuit is brought to a low value. For example, the junction temperature of the reference generator and circuit may be brought to 0 C, −20 C, or −40 C. Other temperature values may be used.

At S60, the register of the reference generator is programmed with a code value. In response to the register being programmed, the reference generator receives a signal corresponding with the programmed code value. In response to the reference generator receiving the signal, the reference generator generates a reference value based on the temperature and on the received signal.

At S62, the input of the circuit is set to an input value. In response to the input value at the input, and in response to the reference value received from the reference generator, the circuit generates an output value, as described above.

At S65, the output value is measured and stored in a memory.

At S67, a determination is made as to whether additional circuit input values are to be used. If additional circuit input values are to be used, the method returns to S62. If additional circuit input values are not to be used, at S70, a determination is made as to whether additional code values are to be programmed in the register. If additional code values are to be programmed in the register, the method returns to S60. If additional code values are not to be programmed in the register, at S75, the temperature of the reference generator and the circuit is brought to a high value. For example, the junction temperature of the reference generator and circuit may be brought to 100 C, 120 C, 140 C, or 160 C. Other temperature values may be used.

In some embodiments, the low or high temperature is set using at least one of: heating the electronic device in an oven, cooling the electronic device in a cooler, operating the electronic device in a power mode corresponding to the temperature to be set, sensing a temperature of the device, and adjusting the temperature based on the sensed temperature.

At S80, the register of the reference generator is programmed with a code value. In response to the register being programmed, the reference generator receives a signal corresponding with the programmed code value. In response to the reference generator receiving the signal, the reference generator generates a reference value based on the temperature and on the received signal.

At S82, the input of the circuit is set to an input value. In response to the input value at the input, and in response to the reference value received from the reference generator, the circuit generates an output value, as described above.

At S85, the output value is measured and stored in a memory.

At S87, a determination is made as to whether additional circuit input values are to be used. If additional circuit input values are to be used, the method returns to S82. If additional circuit input values are not to be used, at S90, a determination is made as to whether additional code values are to be programmed in the register. If additional code values are to be programmed in the register, the method returns to S80. If additional code values are not to be programmed in the register, at S95, a register value is selected.

To select a register value, the temperature dependence of the output values associated with each register code value for each input value may be determined by calculating a difference between the generated output values for each register code value at two or more temperatures for each input value. The temperature dependence of the output values associated with each register code value may be determined by averaging the temperature dependence of the output values associated with each register code value for all input values. The temperature dependences resulting from the various register values are compared, and the register code value resulting in a minimum output value temperature dependence may be selected as the register value.

For example, two input values may have been be used for each register code value. To calculate a temperature dependence of the output values associated with a particular register code value, a first temperature dependence is calculated for the first input value by calculating the difference between the output values generated at the high and low temperatures using the first input value. In addition, a second temperature dependence is calculated for the second input value by calculating the difference between the output values generated at the high and low temperatures using the second input value. The temperature dependence of the output values associated with the particular register code value may then be calculated by averaging the temperature dependences of the two input values.

Alternative methods may be used for calibrating the reference generator and associated register. For example, a binary search algorithm may be used. In some embodiments, instead of using the same input values at different register and temperature values, the input value is changed so as to use the same output values at the different register and temperature values.

Figure 11:
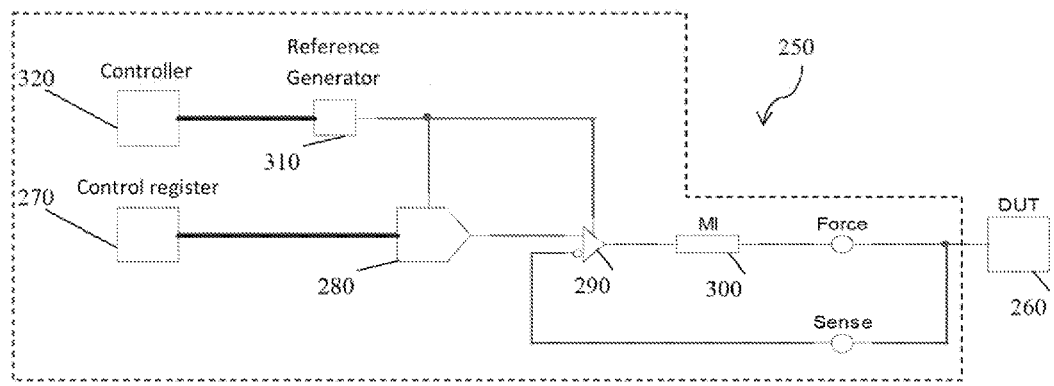
FIG. 11 is a block diagram of a force voltage system which is configured to generate a voltage for a DUT.

FIG. 11 is a block diagram of a force voltage system 250 which is configured to generate a voltage for DUT 260. Force voltage system 250 may be used, for example, within an ATE system such as ATE system 150 of FIG. 7. For example, force voltage system 250 may be used in DPS 170 or PMU 190 of ATE system 150.

In this embodiment, force voltage system 250 is configured to generate a voltage for DUT 260 on conductor Force, where the voltage is based on a digital value in programmable control register 270. The digital value of programmable register 270 is passed to DAC 280. The DAC 280 converts the digital value from the programmable register 270 into an analog value for difference amplifier 290.

Difference amplifier 290 receives the analog value from the DAC 280 and receives the voltage provided to DUT 260 through conductor Sense. Difference amplifier 290 generates a difference voltage based on the difference between the analog value from the DAC 280 and the voltage received through conductor Sense. The difference voltage is provided to measure current (MI) circuit 300, which is discussed in more detail below. A force voltage is provided to the DUT 260 through conductor Force, where the force voltage is based on the difference voltage from difference amplifier 290, and is substantially equal to the analog value from the DAC 280.

In this embodiment, DAC 280 and difference amplifier 290 each receive a reference voltage from reference generator 310, where the reference voltage is generated by reference generator 310 based on a value received from programmable controller 320. Reference voltage generator 310 may be similar to other reference generators discussed herein. In some embodiments, DAC 280 and difference amplifier 290 each receive a reference voltage from a different reference generator.

The relationship between each of the DAC 280 and difference amplifier 290, and the combination of the reference generator 310 and the controller 320 is similar to the relationship between circuit 220 and reference generator 230 as discussed above with reference to FIG. 8. Accordingly, the force voltage system 250 generates an output voltage for DUT 260 based on the digital value of programmable register 270 and based on the reference voltage from reference generator 310.

To facilitate this operation, each of the DAC 280 and the difference amplifier 290 includes an input unit configured to receive the reference voltage, and an output unit configured to generate an output, where the output of each of the DAC 280 and the difference amplifier 290 is dependent at least in part on the reference voltage and is controllably dependent on a temperature. Because the output voltage of system 250 is based on the output of the DAC 280 and the difference amplifier 290, a change in the voltage output of system 250 in response to a change in the temperature is based partly on the reference voltage.

Figure 12A:
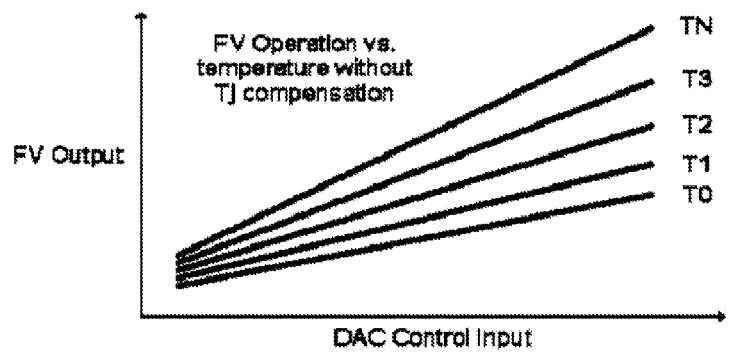
FIGS. 12A and 12B illustrate graphs showing the input/output characteristics of force voltage system for various temperatures T0-TN, where the control register of the reference generator is programmed with a various values.
Figure 12B:
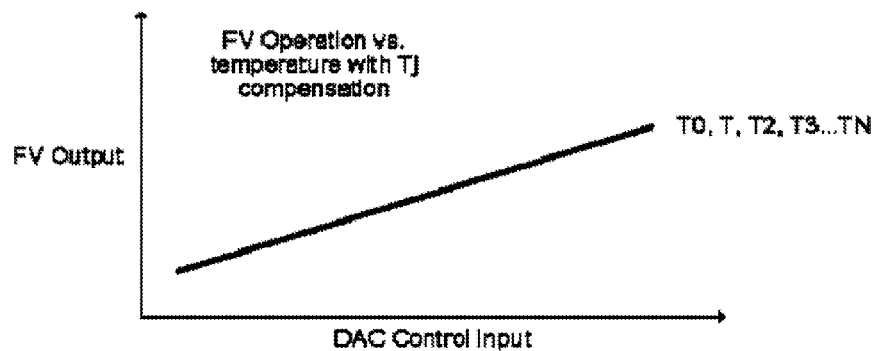

FIG. 12A illustrates a graph showing the input/output characteristics of force voltage system 250 for various temperatures T0-TN, where the control register 320 of reference generator 310 is programmed with a first value. As shown, the input/output characteristics of force voltage system 250 vary significantly with temperature. FIG. 12B illustrates a graph showing the input/output characteristics of force voltage system 250 for the temperatures T0-TN, where the control register 320 of reference generator 310 is programmed with a second value. As shown, the input/output characteristics of system 250 do not significantly vary with temperature when the control register 320 is programmed with the second value.

To facilitate this operation, reference generator 310 includes an input unit configured to receive a control input, and an output unit configured to generate the reference voltage for the DAC 280 and the difference amplifier 290. The reference voltage is dependent at least in part on the temperature, and the temperature dependence of the reference voltage is based at least in part on the control input.

Figure 13:
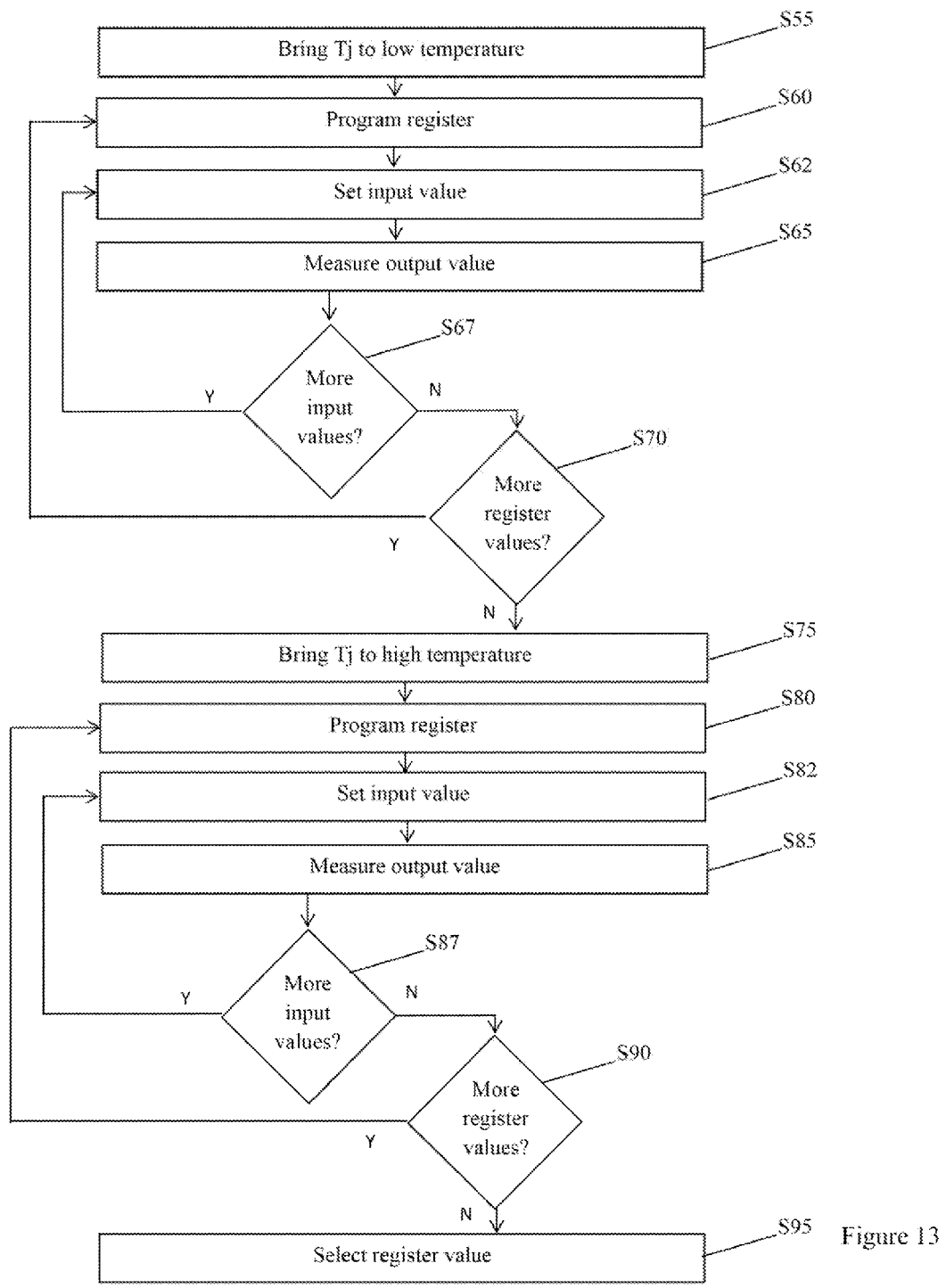
FIG. 13 is a flowchart diagram illustrating an embodiment of a method of calibrating the system of FIG. 11.

FIG. 13 is a flowchart diagram illustrating an embodiment of a method of calibrating system 250. Other methods of calibration may alternatively be used.

At S55, the temperature of the system 250 is brought to a low value. For example, the junction temperature of the system 250 may be brought to 0 C, −20 C, or −40 C. Other temperature values may be used.

At S60, the register 320 of the reference generator 310 is programmed with a code value. In response to the register 320 being programmed, the reference generator 310 receives a signal corresponding with the programmed code value. In response to the reference generator 310 receiving the signal, the reference generator 310 generates a reference value based on the temperature and on the received signal.

At S62, the register 270 is programmed with an input value. In response to the input value, and in response to the reference value received from the reference generator 310, the system 250 generates an output voltage, as described above.

At S65, the output voltage is measured and stored in a memory.

At S67, a determination is made as to whether additional input values are to be used. If additional input values are to be used, the method returns to S62. If additional input values are not to be used, at S70, a determination is made as to whether additional code values are to be programmed in the register 320. If additional code values are to be programmed in the register 320, the method returns to S60. If additional code values are not to be programmed in the register 320, at S75, the temperature of the system 250 is brought to a high value. For example, the junction temperature of the system 250 may be brought to 100 C, 120 C, 140 C, or 160 C. Other temperature values may be used.

In some embodiments, the low or high temperature is set using at least one of: heating the electronic device in an oven, cooling the electronic device in a cooler, operating the electronic device in a power mode corresponding to the temperature to be set, sensing a temperature of the device, and adjusting the temperature based on the sensed temperature.

At S80, the register 320 is programmed with a code value. In response to the register 320 being programmed, the reference generator 310 receives a signal corresponding with the programmed code value. In response to the reference generator 310 receiving the signal, the reference generator 310 generates a reference value based on the temperature and on the received signal.

At S82, the register 270 is programmed with an input value. In response to the input value, and in response to the reference value received from the reference generator 310, the system 250 generates an output voltage, as described above.

At S85, the output voltage is measured and stored in a memory.

At S87, a determination is made as to whether additional input values are to be used. If additional input values are to be used, the method returns to S82. If additional input values are not to be used, at S90, a determination is made as to whether additional code values are to be programmed in the register 320. If additional code values are to be programmed in the register 320, the method returns to S80. If additional code values are not to be programmed in the register 320, at S95, a register value is selected.

To select a register value, the temperature dependence of the output voltages associated with each register code value for each input value may be determined by calculating a difference between the generated output voltages for each register code value at the two temperatures for each input value. The temperature dependence of the output voltages associated with each register code value may be determined by averaging the temperature dependence of the output voltages associated with each register code value for all input values. The temperature dependences resulting from the various register values are compared, and the register code value resulting in a minimum output voltage temperature dependence may be selected as the register value.

For example, two input values may have been be used for each register code value. To calculate a temperature dependence of the output voltages associated with a particular register code value, a first temperature dependence is calculated for the first input value by calculating the difference between the output voltages generated at the high and low temperatures using the first input value. In addition, a second temperature dependence is calculated for the second input value by calculating the difference between the output voltages generated at the high and low temperatures using the second input value. The temperature dependence of the output voltages associated with the particular register code value may then be calculated by averaging the temperature dependences of the two input values.

Alternative methods may be used for calibrating the system 250. For example, a binary search algorithm may be used. In some embodiments, instead of using the same input values at different register and temperature values, the input value is changed so as to use the same output values at the different register and temperature values.

Figure 14:
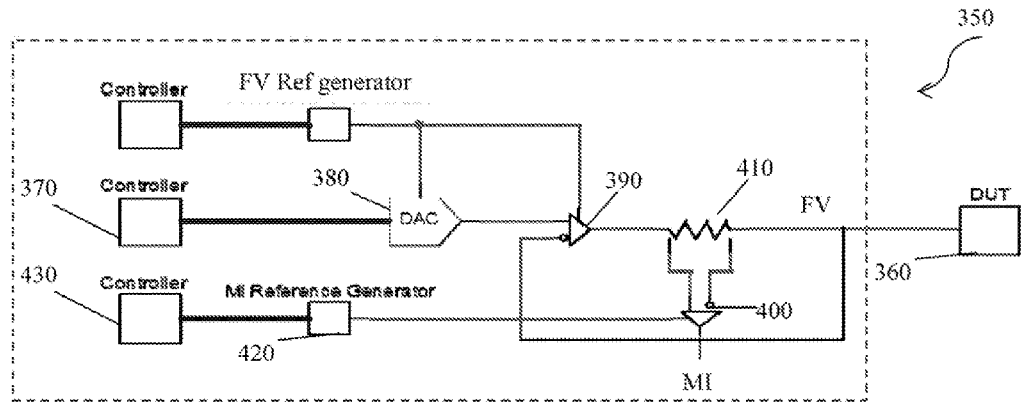
FIG. 14 is a block diagram of a measure current system which is configured to measure a current applied to DUT.

FIG. 14 is a block diagram of a measure current system 350 which is configured to measure a current applied to DUT 360. Measure current system 350 may be used, for example, within an ATE system such as ATE system 150 of FIG. 7. For example, measure current system 350 may be used in DPS 170 or PMU 190 of ATE system 150.

In this embodiment, measure current system 350 is configured to measure a current applied to DUT 360 using conductor FV, where the current is based on a voltage forced at DUT 360. The forced voltage is based on a digital value in programmable control register 370. The digital value of programmable register 370 is passed to DAC 380. The DAC 380 converts the digital value from the programmable register 370 into an analog value for difference amplifier 390.

Difference amplifier 390 receives the analog value from the DAC 380 and receives the voltage provided to DUT 360. Difference amplifier 390 generates a difference voltage based on the difference between the analog value from the DAC 380 and the voltage applied to DUT 360. The difference voltage is provided to measure current resistor 410 and a force voltage is provided to the DUT 360. A current is provided to resistor 410 based on the difference voltage, the resistance of resistor 410, and the force voltage. The current passes through resistor 410 and is applied to DUT 360. A voltage across resistor 410 is generated in response to the value of the current. Difference amplifier 400 generates a current sense signal MI based on the voltage across resistor 410.

Difference amplifier 400 receives a reference voltage from reference generator 420, where the reference voltage is generated by reference generator 420 based on a value received from programmable controller 430. Reference voltage generator 420 may be similar to other reference generators discussed herein.

The relationship between the difference amplifier 400, and the combination of the reference generator 420 and the controller 430 is similar to the relationship between circuit 220 and reference generator 230 as discussed above with reference to FIG. 8. Accordingly, the measure current system 350 generates current sense signal MI based on the voltage across resistor 410 and based on the reference voltage from reference generator 420.

To facilitate this operation, difference amplifier 400 includes an input unit configured to receive the reference voltage, and an output unit configured to generate an output, where the output of difference amplifier 400 is dependent at least in part on the reference voltage and is controllably dependent on a temperature. Accordingly, because the current sense signal MI is based on the output of difference amplifier 400, a change in the current sense signal MI in response to a change in the temperature is based partly on the reference voltage.

Figure 15A:
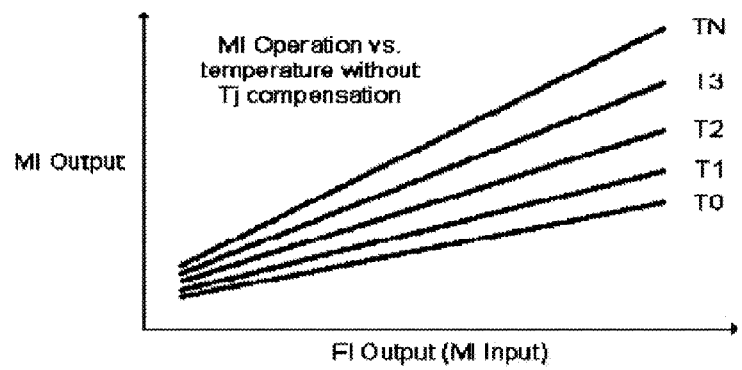
FIGS. 15A-15B illustrate a graph showing the input/output characteristics of a measure current system for various temperatures T0-TN, where the control register of the reference generator is programmed with various values.
Figure 15B:
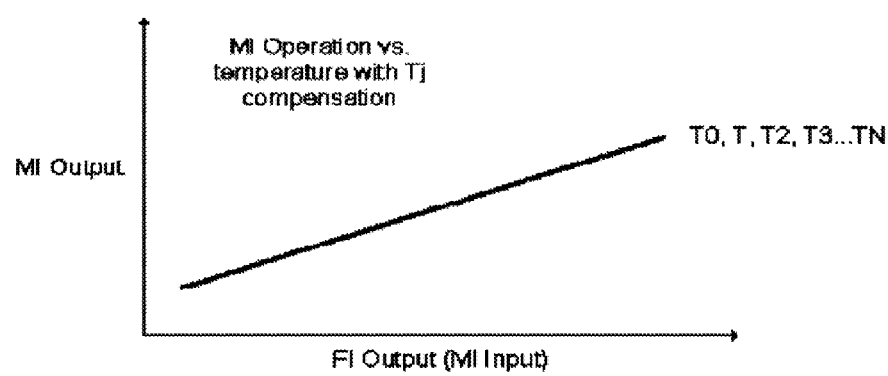

FIG. 15A illustrates a graph showing the input/output characteristics of measure current system 350 for various temperatures T0-TN, where the control register 430 of reference generator 420 is programmed with a first value. As shown, the input/output characteristics of measure current system 350 vary significantly with temperature. FIG. 15B illustrates a graph showing the input/output characteristics of measure current system 350 for the temperatures T0-TN, where the control register 430 of reference generator 420 is programmed with a second value. As shown, the input/output characteristics of measure current system 350 do not significantly vary with temperature when the control register 430 is programmed with the second value.

To facilitate this operation, reference generator 420 includes an input unit configured to receive a control input, and an output unit configured to generate the reference voltage for the difference amplifier 400. The reference voltage is dependent at least in part on the temperature, and the temperature dependence of the reference voltage is based at least in part on the control input, which, in this embodiment, is provided by controller 430.

Figure 16:
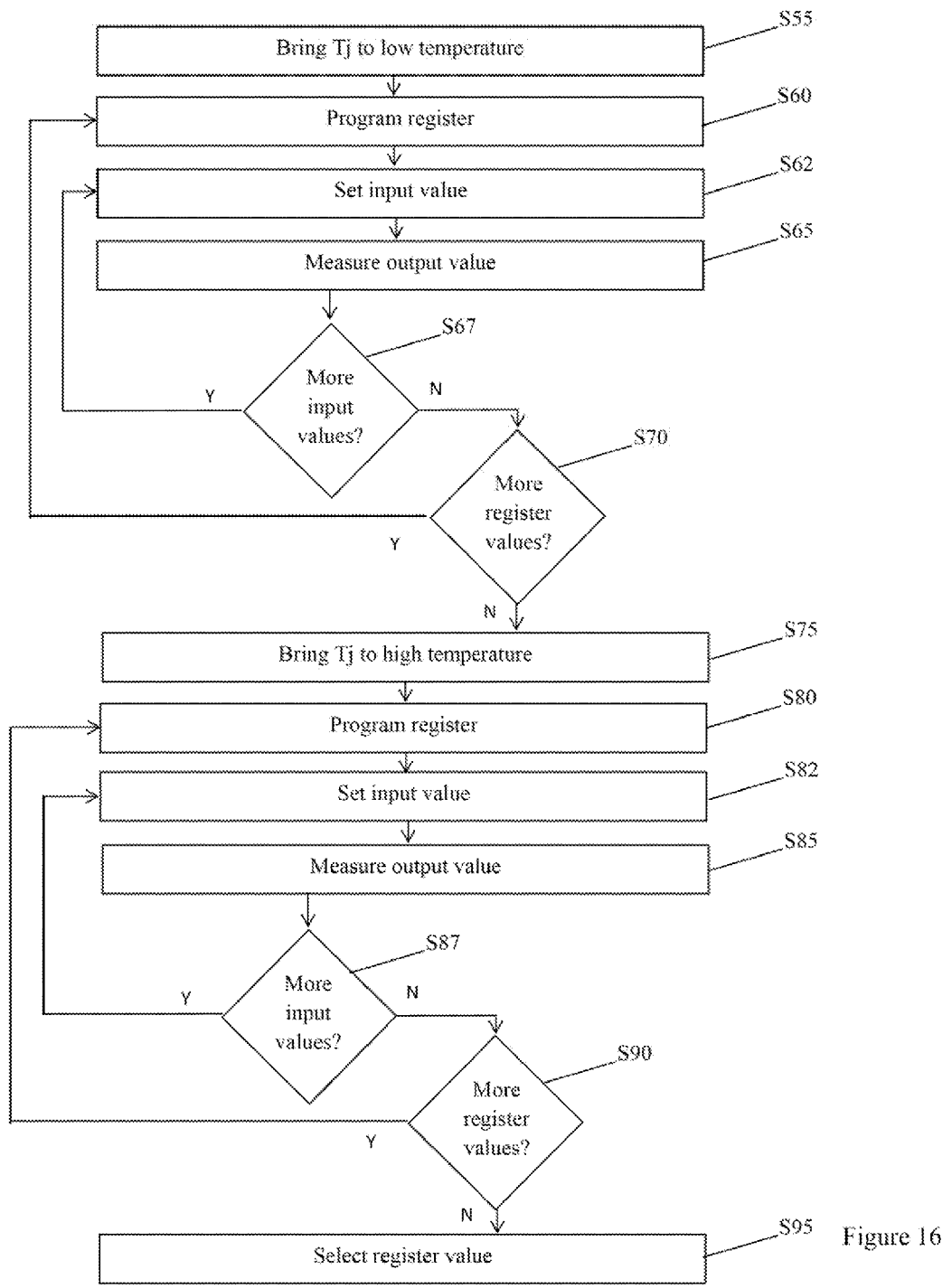
FIG. 16 is a flowchart diagram illustrating an embodiment of a method of calibrating the system of FIG. 14.

FIG. 16 is a flowchart diagram illustrating an embodiment of a method of calibrating system 350. Other methods of calibration may alternatively be used.

At S55, the temperature of the system 350 is brought to a low value. For example, the junction temperature of the system 350 may be brought to 0 C, −20 C, or −40 C. Other temperature values may be used.

At S60, the register 430 of the reference generator 420 is programmed with a code value. In response to the register 430 being programmed, the reference generator 420 receives a signal corresponding with the programmed code value. In response to the reference generator 420 receiving the signal, the reference generator 420 generates a reference value based on the temperature and on the received signal.

At S62, the register 370 is programmed with an input value. In response to the input value, and in response to the reference value received from the reference generator 420, the system 350 generates an current sense signal MI, as described above.

At S65, the current sense signal MI is measured and stored in a memory.

At S67, a determination is made as to whether additional input values are to be used. If additional input values are to be used, the method returns to S62. If additional input values are not to be used, at S70, a determination is made as to whether additional code values are to be programmed in the register 430. If additional code values are to be programmed in the register 430, the method returns to S60. If additional code values are not to be programmed in the register 430, at S75, the temperature of the system 350 is brought to a high value. For example, the junction temperature of the system 350 may be brought to 100 C, 120 C, 140 C, or 160 C. Other temperature values may be used.

In some embodiments, the low or high temperature is set using at least one of: heating the electronic device in an oven, cooling the electronic device in a cooler, operating the electronic device in a power mode corresponding to the temperature to be set, sensing a temperature of the device, and adjusting the temperature based on the sensed temperature.

At S80, the register 430 is programmed with a code value. In response to the register 430 being programmed, the reference generator 420 receives a signal corresponding with the programmed code value. In response to the reference generator 420 receiving the signal, the reference generator 420 generates a reference value based on the temperature and on the received signal.

At S82, the register 370 is programmed with an input value. In response to the input value, and in response to the reference value received from the reference generator 420, the system 350 generates a current sense signal MI, as described above.

At S85, the current sense signal MI is measured and stored in a memory.

At S87, a determination is made as to whether additional input values are to be used. If additional input values are to be used, the method returns to S82. If additional input values are not to be used, at S90, a determination is made as to whether additional code values are to be programmed in the register 430. If additional code values are to be programmed in the register 430, the method returns to S80. If additional code values are not to be programmed in the register 430, at S95, a register value is selected.

To select a register value, the temperature dependence of the output voltages associated with each register code value for each input value may be determined by calculating a difference between the generated current sense signals for each register code value at the two temperatures for each input value. The temperature dependence of the current sense signals associated with each register code value may be determined by averaging the temperature dependence of the current sense signal associated with each register code value for all input values. The temperature dependences resulting from the various register code values are compared, and the register code value resulting in a minimum current sense signal temperature dependence may be selected as the register value.

For example, two input values may have been be used for each register code value. To calculate a temperature dependence of the current sense signal associated with a particular register code value, a first temperature dependence is calculated for the first input value by calculating the difference between the current sense signals generated at the high and low temperatures using the first input value. In addition, a second temperature dependence is calculated for the second input value by calculating the difference between the current sense signals generated at the high and low temperatures using the second input value. The temperature dependence of the current sense signals associated with the particular register code value may then be calculated by averaging the temperature dependences of the two input values.

Alternative methods may be used for calibrating the system 350. For example, a binary search algorithm may be used. In some embodiments, instead of using the same input values at different register and temperature values, the input value is changed so as to use the same output values at the different register and temperature values.

Figure 17:
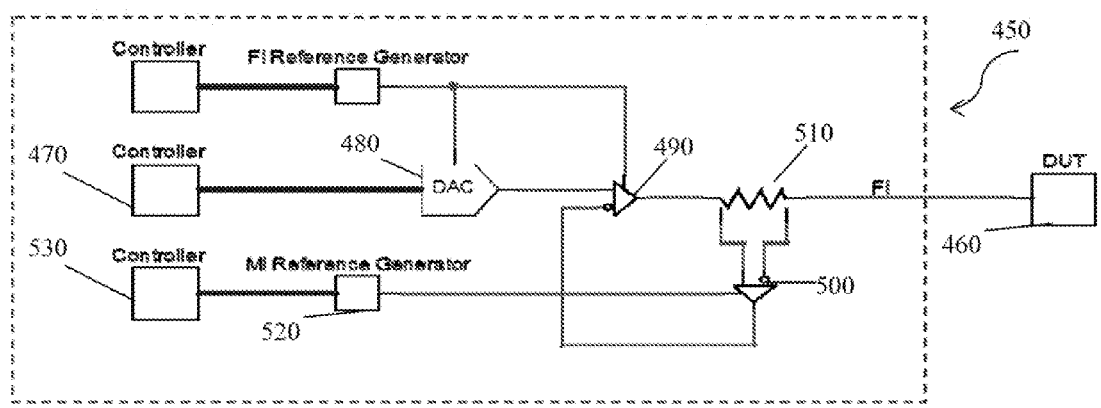
FIG. 17 is a block diagram of a force current system which is configured to force a current applied to a DUT.

FIG. 17 is a block diagram of a force current system 450 which is configured to force a current applied to DUT 460. Force current system 450 may be used, for example, within an ATE system such as ATE system 150 of FIG. 7. For example, measure current system 450 may be used in DPS 170 or PMU 190 of ATE system 150.

In this embodiment, force current system 450 is configured to force a current applied to DUT 460 on conductor FI, where the current is based on a digital value in programmable control register 470. The digital value of programmable register 470 is passed to DAC 480. The DAC 480 converts the digital value from the programmable register 470 into an analog value for difference amplifier 490.

Difference amplifier 490 receives the analog value from the DAC 480 and receives a feedback voltage from difference amplifier 500. Difference amplifier 490 generates a difference voltage based on the difference between the analog value from the DAC 480 and the feedback voltage. A current is provided to resistor 510 based on the difference voltage, the resistance of resistor 510, and a voltage at DUT 460. The current passes through resistor 510 and is applied to DUT 460. A voltage across resistor 510 is generated in response to the value of the current. Difference amplifier 500 generates the feedback voltage for difference amplifier 490 based on the voltage across resistor 510.

In some embodiments, the reference generator for DAC 480 and difference amplifier 490 and reference generator 520 for difference amplifier 500 have each been calibrated in accordance with a method described above. As a result, the force current system 450 is also calibrated. Therefore, in some embodiments, no further calibration is performed.

In some embodiments, the force current system 450 may be used to calibrate either the reference generator for DAC 480 and difference amplifier 490 or reference generator 520, where the other of the reference generator for DAC 480 and difference amplifier 490 and reference generator 520 has been previously calibrated. Calibration of the reference generator for DAC 480 and difference amplifier 490 or reference generator 520 may be accomplished using a method similar to the methods described herein.

Figure 18:
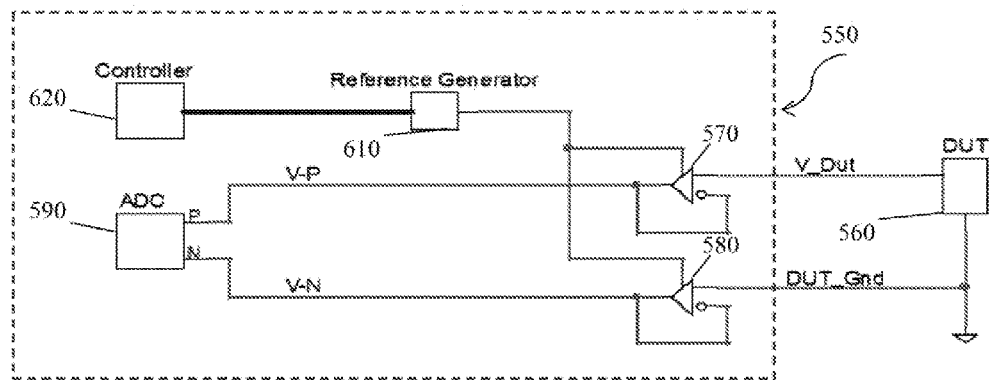
FIG. 18 is a block diagram of a measure voltage system which is configured to generate a voltage for a DUT.

FIG. 18 is a block diagram of a measure voltage system 550 which is configured to generate a voltage for DUT 560. Measure voltage system 550 may be used, for example, within an ATE system such as ATE system 150 of FIG. 7. For example, measure voltage system 550 may be used in DPS 170 or PMU 190 of ATE system 150.

In this embodiment, measure voltage system 550 is configured to measure an input voltage from DUT 560. In this embodiment, the input voltage is the voltage of conductor V_Dut with respect to a voltage on conductor DUT_Gnd. The voltage difference between conductor V_Dut and conductor DUT_Gnd is buffered by difference amplifiers 570 and 580. The buffered voltage difference is applied across conductors V-P and V-N for ADC 590. ADC 590 receives the buffered voltage difference and produces an output voltage, which is a digital value representing the buffered voltage difference.

In this embodiment, difference amplifiers 570 and 580 each receive a reference voltage from reference generator 610, where the reference voltage is generated by reference generator 610 is based on a value received from programmable controller 620. Reference voltage generator 610 may be similar to other reference generators discussed herein. In some embodiments, difference amplifiers 570 and 580 each receive a reference voltage from a different reference generator.

The relationship between each of the difference amplifiers 570 and 580 and the combination of the reference generator 610 and the controller 620 is similar to the relationship between circuit 220 and reference generator 230 as discussed above with reference to FIG. 8. Accordingly, the measure voltage system 550 generates an output voltage for DUT 560 based on the voltage difference between conductor V_Dut and conductor DUT_Gnd, and based on the reference voltage from reference generator 610.

To facilitate this operation, each of the difference amplifiers 570 and 580 includes an input port configured to receive the reference voltage, and an output port configured to generate an output signal, where the output signal of each of the difference amplifiers 570 and 580 is dependent at least in part on the reference voltage and is controllably dependent on a temperature. Accordingly, because the output of system 550 is based on the outputs of difference amplifiers 570 and 580, a change in the output of system 550 in response to a change in the temperature is based partly on the reference voltage.

Figure 19A:
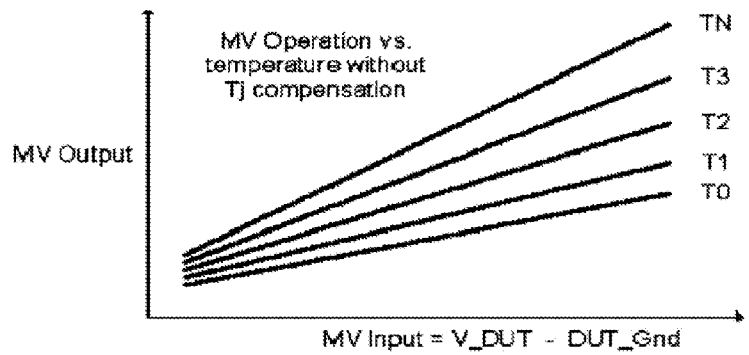
FIGS. 19A and 19B illustrate graphs showing the input/output characteristics of the force voltage system for various temperatures T0-TN, where the control register of the reference generator is programmed with various values.
Figure 19B:
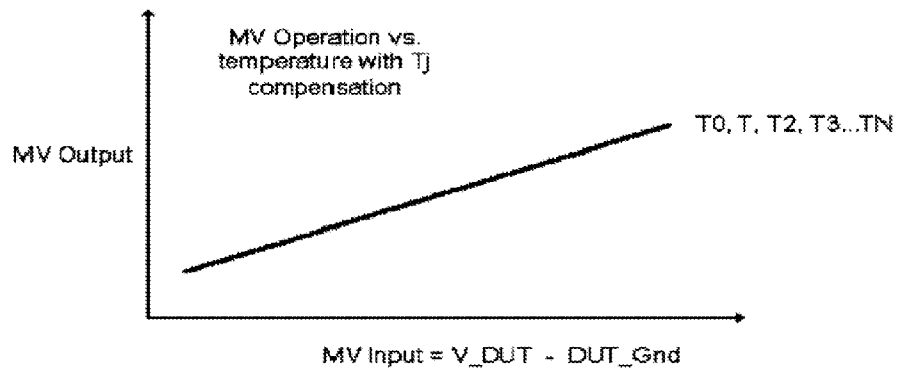

FIG. 19A illustrates a graph showing the input/output characteristics of force voltage system 550 for various temperatures T0-TN, where the control register 620 of reference generator 610 is programmed with a first value. As shown, the input/output characteristics of force voltage system 550 vary significantly with temperature. FIG. 19B illustrates a graph showing the input/output characteristics of force voltage system 550 for the temperatures T0-TN, where the control register 620 of reference generator 610 is programmed with a second value. As shown, the input/output characteristics of system 550 do not significantly vary with temperature when the control register 320 is programmed with the second value.

To facilitate this operation, reference generator 610 includes an input unit configured to receive a control input, and an output unit configured to generate the reference voltage for difference amplifiers 570 and 580. The reference voltage is dependent at least in part on the temperature, and the temperature dependence of the reference voltage is based at least in part on the control input.

Figure 20:
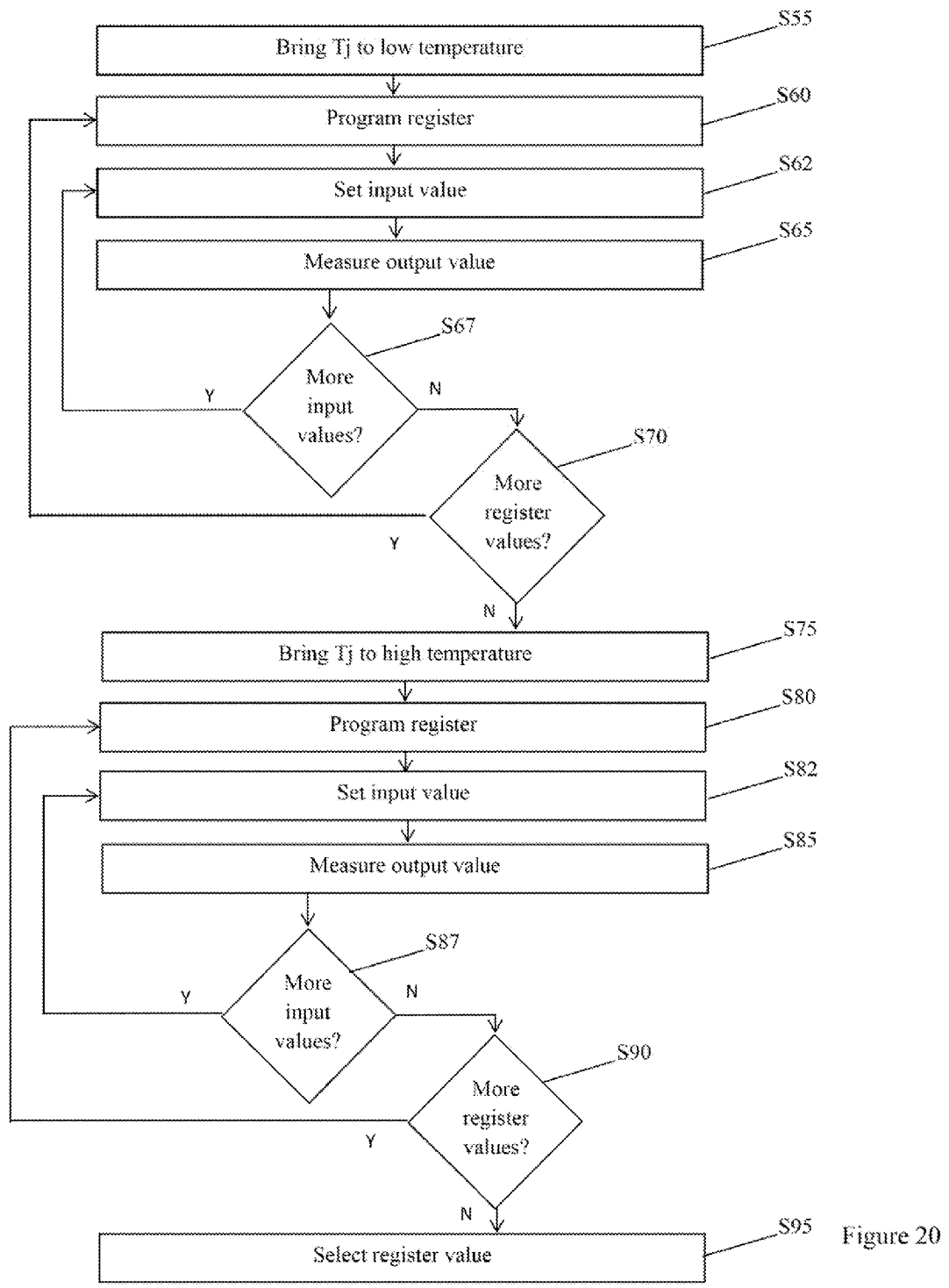
FIG. 20 is a flowchart diagram illustrating an embodiment of a method of calibrating the system of FIG. 18.

FIG. 20 is a flowchart diagram illustrating an embodiment of a method of calibrating system 550. Other methods of calibration may alternatively be used.

At S55, the temperature of the system 550 is brought to a low value. For example, the junction temperature of the system 550 may be brought to 0 C, −20 C, or −40 C. Other temperature values may be used.

At S60, the register 620 of the reference generator 610 is programmed with a code value. In response to the register 620 being programmed, the reference generator 610 receives a signal corresponding with the programmed code value. In response to the reference generator 610 receiving the signal, the reference generator 610 generates a reference value based on the temperature and on the received signal.

At S62, the DUT 560 is caused to generate an input value. For example, DUT 560 may be a resistor of a known value, and a current may be forced through the resistor to generate a known voltage input. In alternative embodiments, a DUT 560 is not used, and instead, the ATE system is configured to force a calibrated input voltage value across conductor V_Dut and conductor DUT_Gnd. In response to the input value, and in response to the reference value received from the reference generator 610, the system 550 generates an output voltage, as described above.

At S65, the output voltage is measured and stored in a memory.

At S67, a determination is made as to whether additional input values are to be used. If additional input values are to be used, the method returns to S62. If additional input values are not to be used, at S70, a determination is made as to whether additional code values are to be programmed in the register 620. If additional code values are to be programmed in the register 620, the method returns to S60. If additional code values are not to be programmed in the register 620, at S75, the temperature of the system 550 is brought to a high value.

For example, the junction temperature of the system 550 may be brought to 100 C, 120 C, 140 C, or 160 C. Other temperature values may be used.

In some embodiments, the low or high temperature is set using at least one of: heating the electronic device in an oven, cooling the electronic device in a cooler, operating the electronic device in a power mode corresponding to the temperature to be set, sensing a temperature of the device, and adjusting the temperature based on the sensed temperature.

At S80, the register 620 is programmed with a code value. In response to the register 620 being programmed, the reference generator 610 receives a signal corresponding with the programmed code value. In response to the reference generator 610 receiving the signal, the reference generator 610 generates a reference value based on the temperature and on the received signal.

At S82, an input value is forced across conductor V_Dut and conductor DUT_Gnd. In response to the input value, and in response to the reference value received from the reference generator 610, the system 550 generates an output voltage, as described above.

At S85, the output voltage is measured and stored in a memory.

At S87, a determination is made as to whether additional input values are to be used. If additional input values are to be used, the method returns to S82. If additional input values are not to be used, at S90, a determination is made as to whether additional code values are to be programmed in the register 620. If additional code values are to be programmed in the register 620, the method returns to S80. If additional code values are not to be programmed in the register 620, at S95, a register value is selected.

To select a register value, the temperature dependence of the output voltages associated with each register code value for each input value may be determined by calculating a difference between the generated output voltages for each register code value at the two temperatures for each input value. The temperature dependence of the output voltages associated with each register code value may be determined by averaging the temperature dependence of the output voltages associated with each register code value for all input values. The register code value resulting in a minimum output voltage temperature dependence may be selected as the register value.

For example, two input values may have been be used for each register code value. To calculate a temperature dependence of the output voltages associated with a particular register code value, with the particular register code value programmed, a first temperature dependence is calculated for the first input value by calculating the difference between the output voltages generated at the high and low temperatures using the first input value. In addition, a second temperature dependence is calculated for the second input value by calculating the difference between the output voltages generated at the high and low temperatures using the second input value. The temperature dependence of the output voltages associated with the particular register code value may then be calculated by averaging the temperature dependences of the two input values.

Alternative methods may be used for calibrating the system 550. For example, a binary search algorithm may be used. In some embodiments, instead of using the same input values at different register and temperature values, the input value is changed so as to use the same output values at the different register and temperature values.

Figure 21A:
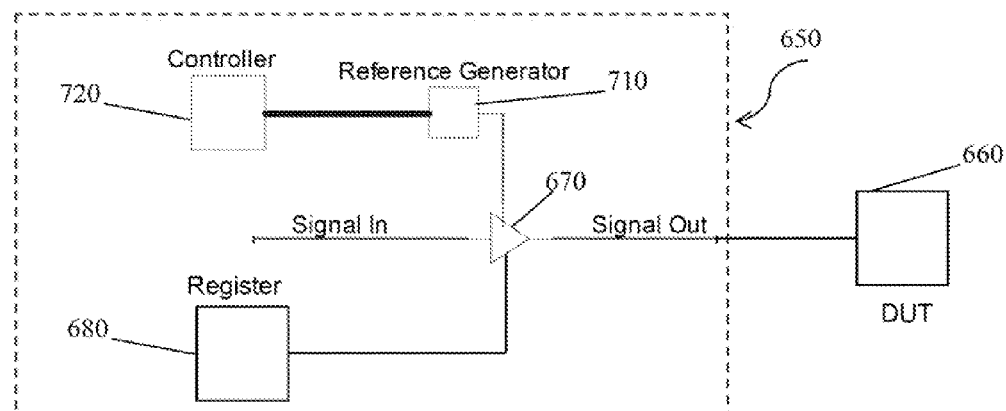
FIG. 21A is a block diagram of a programmable propagation delay system which is configured to provide a signal to a DUT.

FIG. 21A is a block diagram of a programmable propagation delay system 650 which is configured to provide a signal to DUT 660. Propagation delay system 650 may be used, for example, within an ATE system such as ATE system 150 of FIG. 7. For example, propagation delay system 650 may be used in PE 180 of ATE system 150.

In this embodiment, propagation delay system 650 is configured to receive a digital signal on conductor Signal In and provide a delayed version of the digital signal to DUT 660, where the amount of delay is determined by a delay code from programmable register 680.

In this embodiment, propagation delay system 650 includes propagation delay circuit 670, which receives a reference voltage from reference generator 710, where the reference voltage is generated by reference generator 710 based on a value received from programmable controller 720. Reference voltage generator 710 may be similar to other reference generators discussed herein.

The relationship between the propagation delay circuit 670 and the combination of the reference generator 710 and the controller 720 is similar to the relationship between circuit 220 and reference generator 230 as discussed above with reference to FIG. 8. Accordingly, the propagation delay circuit 670 generates an output signal for DUT 660 based on the signal received on conductor Signal In. The output signal has a propagation delay which is based on the delay code from register 680 and on the reference voltage from reference generator 710.

To facilitate this operation, the propagation delay circuit 650 includes an input unit configured to receive an input data signal, and an output unit configured to generate a delayed output signal based on the input data signal, where the delay of the output signal is dependent at least in part on the reference voltage and is controllably dependent on a temperature. Accordingly, a change in the delay of propagation delay circuit 650 in response to a change in the temperature is based partly on the reference voltage.

Figure 21B:
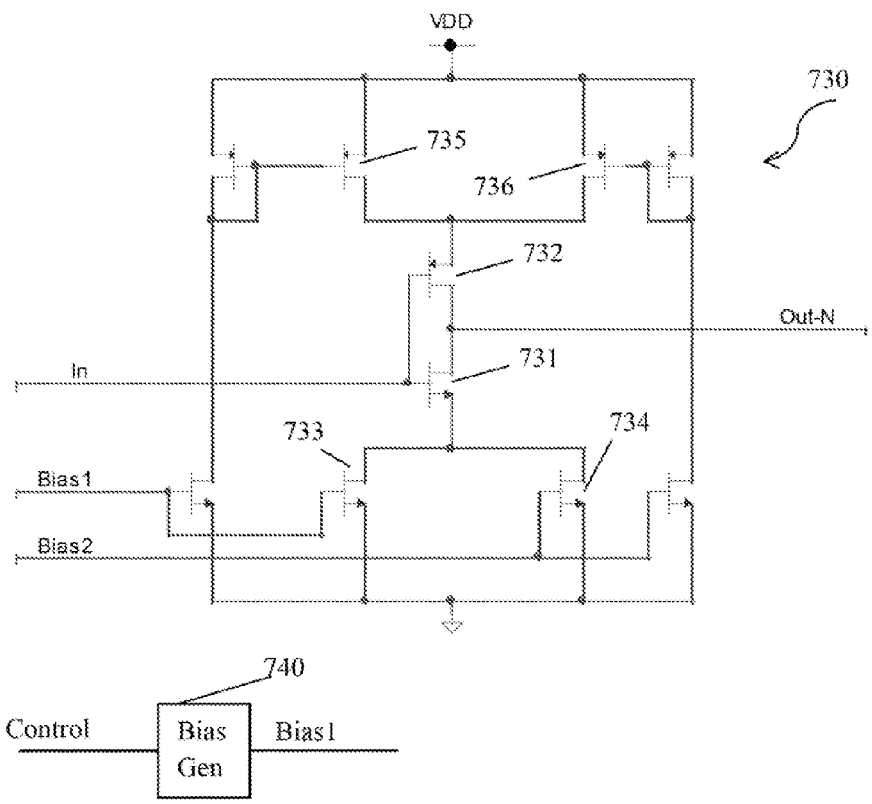
FIG. 21B is a schematic diagram of an embodiment of a propagation delay circuit.

FIG. 21B is a schematic diagram of an embodiment of a propagation delay circuit which may be used as propagation delay circuit 670 in propagation delay system 650. Other propagation delay circuits may alternatively be used in propagation delay system 650.

The propagation delay circuit of FIG. 21B includes propagation delay cell 730 and bias generator 740. Propagation delay cell 730 receives an input signal at In an generates an output signal at Out-N. The delay between the input signal in the output signal is determined by bias voltage Bias1, which is generated by the bias generator 740 and by bias voltage Bias2, which is generated by reference voltage generator 710.

In this embodiment, propagation delay cell 730 is a current starved inverter. The inverter is formed by N device 731 and P device 732. Current for the inverter is determined by N devices 733 and 734 and P devices 735 and 736. The amount of current provided to the inverter by N device 733 and P device 735 is determined by bias voltage Bias1. The amount of current provided to the inverter by N device 734 and P device 736 is determined by bias voltage Bias2.

Bias generator 740 receives a control signal from the programmable register 680 and generates bias voltage Bias1 based on the control signal. In some embodiments, bias generator 740 includes a number of binary weighted P devices (not shown) which each generate a current based on one bit of the control signal. The currents of the P devices are summed into a diode connected N device (not shown), which develops a voltage at its drain-gate node. The developed voltage is provided to propagation delay cell 730 as bias voltage Bias1.

Thus, the amount of current provided to the inverter is determined by bias voltages Bias1 and Bias2, which are respectively generated based on the control signal and the reference voltage from reference voltage generator 710. Therefore, the amount of current provided to the inverter is determined by the control signal and the reference voltage from reference voltage generator 710

Figure 22A:
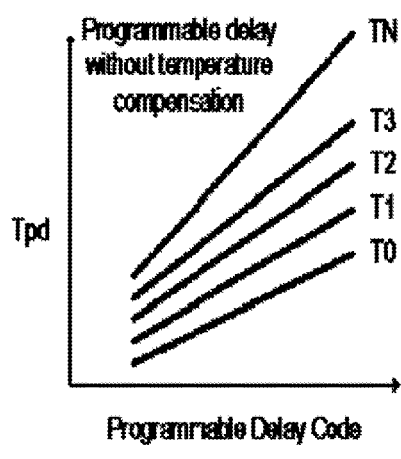
FIGS. 22A and 22C illustrate graphs showing the input/output characteristics of the propagation delay system for various temperatures T0-TN, where the control register of the reference generator is programmed with a various values.
Figure 22B:
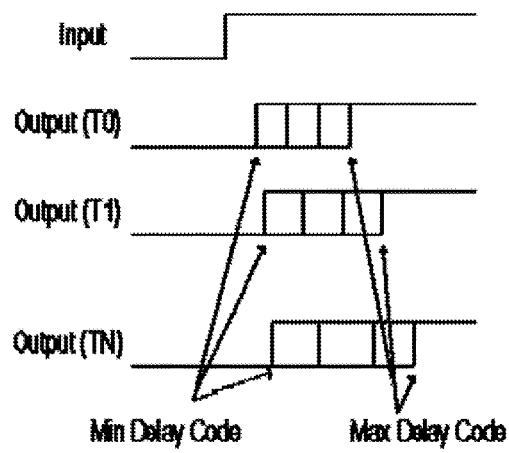
FIGS. 22B and 22D are timing diagrams illustrating the input/output characteristics of the propagation delay system with the control register programmed with the various values.

FIG. 22A illustrates a graph showing the input/output characteristics of propagation delay system 650 for various temperatures T0-TN, where the control register 720 of reference generator 710 is programmed with a first value. As shown, the input/output characteristics of propagation delay system 650 vary significantly with temperature. To further clarify, FIG. 22B is a timing diagram illustrating the input/output characteristics of propagation delay system 650 with the control register 720 programmed with the first value. Outputs at temperatures T0, T1, and TN are shown for the input. As shown, the output is a delayed version of the input, where the amount of delay is dependent on both the delay code from register 680 and on the temperature.

Figure 22C:
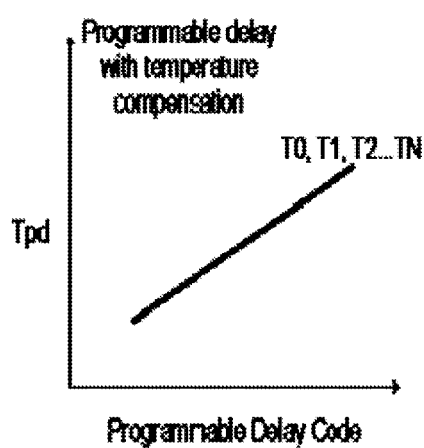
Figure 22D:
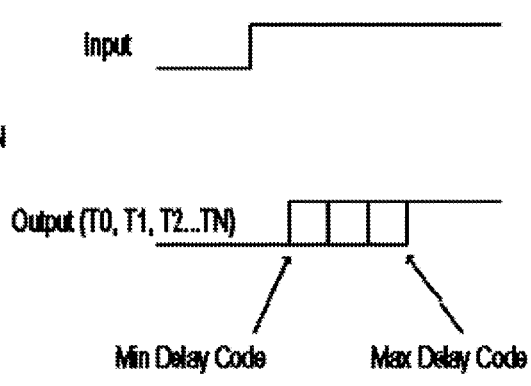

FIG. 22C illustrates a graph showing the input/output characteristics of propagation delay system 650 for the temperatures T0-TN, where the control register 720 of reference generator 710 is programmed with a second value. As shown, the input/output characteristics of propagation delay system 650 do not significantly vary with temperature when the control register 710 is programmed with the second value. To further clarify, FIG. 22D is a timing diagram illustrating the input/output characteristics of propagation delay system 650 with the control register 720 programmed with the second value. Outputs at temperatures T0, T1, T2, and TN are shown for the input. As shown, the output is a delayed version of the input, where the amount of delay is dependent on the delay code from register 680 and is not dependent on the temperature.

To facilitate this operation, reference generator 710 includes an input unit configured to receive a control input, and an output unit configured to generate the reference voltage for propagation delay circuit 670. The reference voltage is dependent at least in part on the temperature, and the temperature dependence of the reference voltage is based at least in part on the control input.

Figure 23:
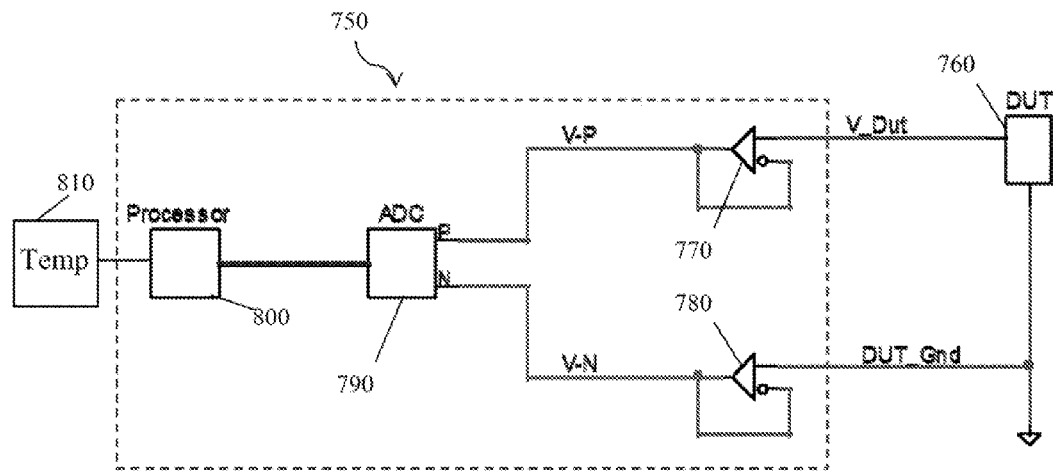
FIG. 23 is a block diagram of a measure voltage system which is configured to generate a voltage for a DUT.

FIG. 23 is a block diagram of a measure voltage system 750 which is configured to generate a voltage for DUT 760. Measure voltage system 750 may be used, for example, within an ATE system such as ATE system 150 of FIG. 7. For example, measure voltage system 750 or parts of measure voltage system 750 may be used in DPS 170 or PMU 190 of ATE system 150.

In this embodiment, measure voltage system 750 is configured to measure an input voltage from DUT 760. In this embodiment, the input voltage is the voltage of conductor V_Dut with respect to a voltage on conductor DUT_Gnd. The voltage difference between conductor V_Dut and conductor DUT_Gnd is buffered by difference amplifiers 770 and 780. The buffered voltage difference is applied across conductors V-P and V-N for ADC 790. ADC 790 receives the buffered voltage difference and produces a digital value representing the buffered voltage difference. The digital value is provided to processor 800

In this embodiment, compensation for variation in the output voltage caused by temperature variation may be provided by processor 800. For example, processor 800 may be programmed with instructions which cause the processor 800 to calculate a compensated voltage value using a compensation function based on the digital value from the ADC 790 and based on a temperature value from temperature sensor 810. The compensation function has one or more compensation parameters which may be determined using a calibration method. In some embodiments, processor 800 is hardwired to perform the calculation, for example, as a fixed circuit. In some embodiments, the compensated voltage value represents the measured input voltage as compensated for temperature variation of the difference amplifiers 770 and 780. In some embodiments, the compensated voltage value represents the measured input voltage as compensated for temperature variation of the difference amplifiers 770 and 780 and the ADC 790.

Figure 24A:
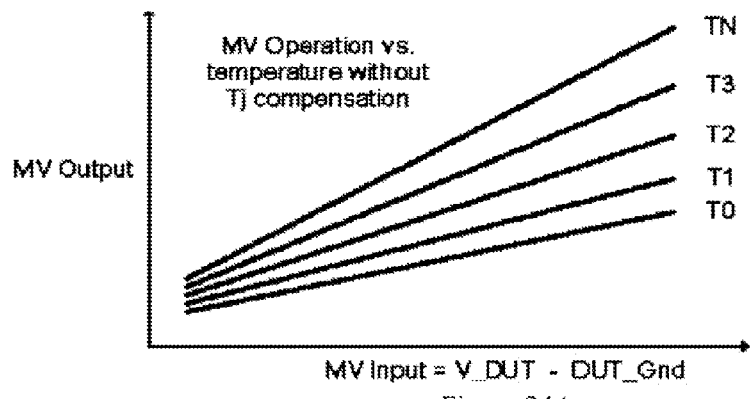
FIGS. 24A and 24B illustrate a graph showing the input/output characteristics of the measure voltage system for various temperatures T0-TN, where the compensation function has various values for one or more compensation parameters.
Figure 24B:
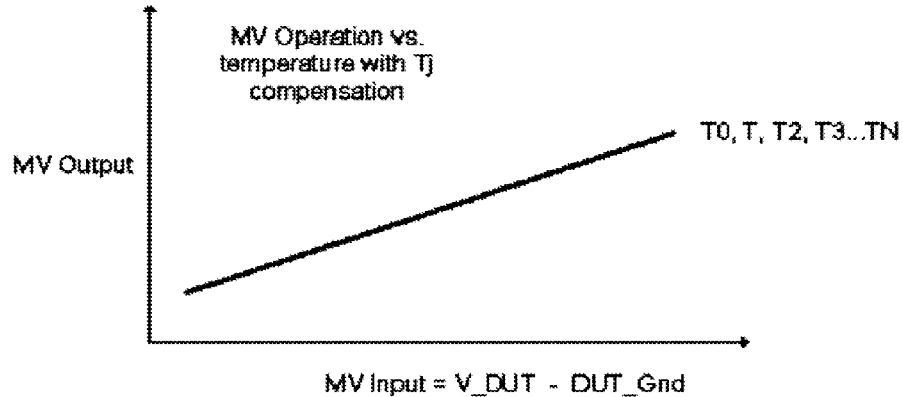

FIG. 24A illustrates a graph showing the input/output characteristics of measure voltage system 750 for various temperatures T0-TN, where the compensation function has first values for the one or more compensation parameters. As shown, the input/output characteristics of measure voltage system 750 vary significantly with temperature. FIG. 24B illustrates a graph showing the input/output characteristics of measure voltage system 750 for the temperatures T0-TN, where the compensation function has second values for the one or more compensation parameters. As shown, the input/output characteristics of system 750 do not significantly vary with temperature when the compensation parameters of the compensation function have the second values.

Figure 25:
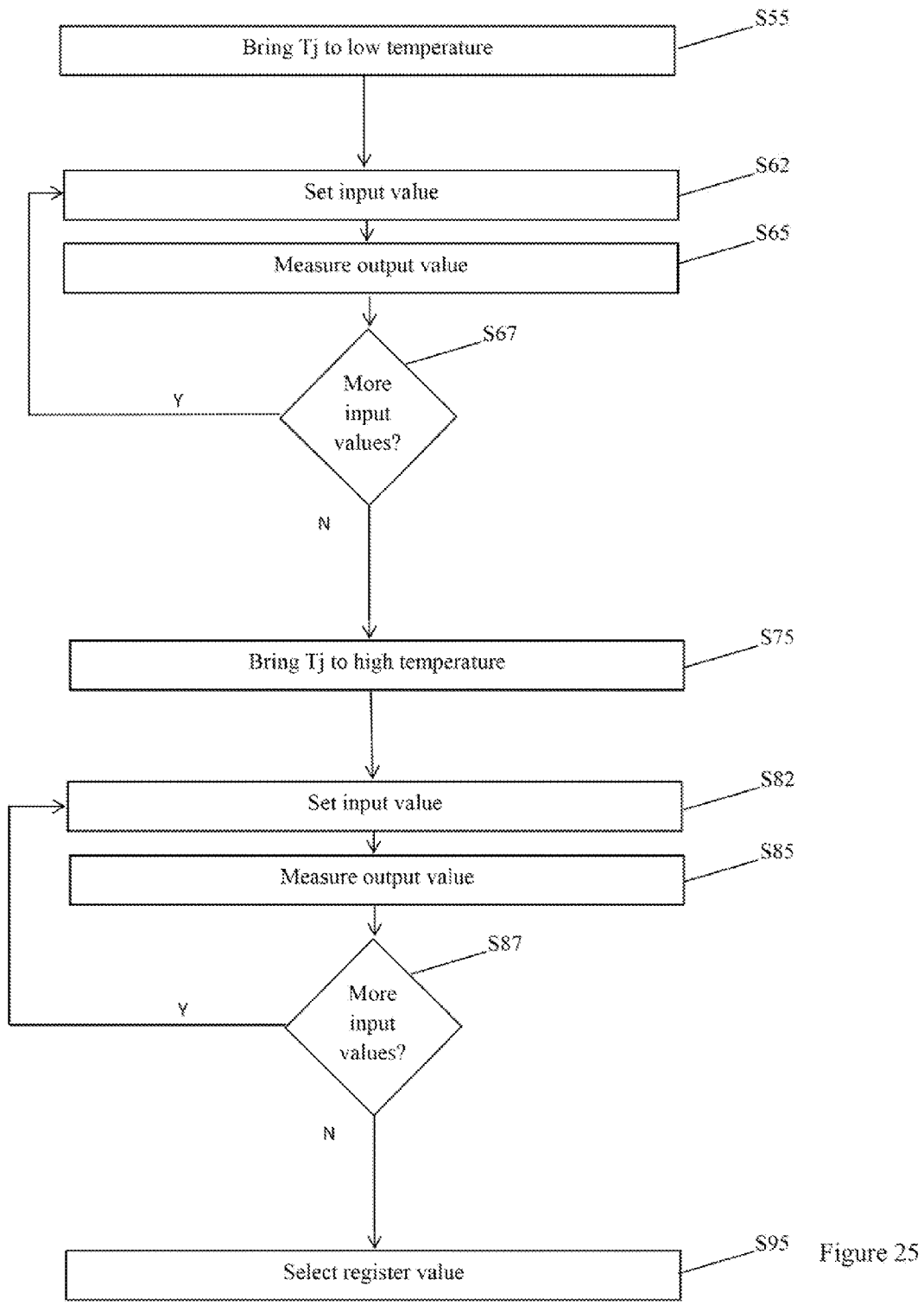
FIG. 25 is a flowchart diagram illustrating an embodiment of a method of calibrating the compensation function of the system of FIG. 23.

FIG. 25 is a flowchart diagram illustrating an embodiment of a method of calibrating the compensation function of system 750. Other methods of calibration may alternatively be used.

At S55, the temperature of the system 750 is brought to a low value. For example, the junction temperature of the system 750 may be brought to 0 C, −20 C, or −40 C. Other temperature values may be used.

At S62, the DUT 760 is caused to generate an input voltage value. For example, DUT 760 may be a resistor of a known value, and a current may be forced through the resistor to generate a known voltage input. In alternative embodiments, a DUT 760 is not used, and instead, the ATE system is configured to force a calibrated input value voltage across conductor V_Dut and conductor DUT_Gnd. In response to the input voltage value, with no compensation, the processor 800 generates an output voltage measurement.

At S65, the output voltage measurement is stored in a memory.

In some embodiments, a junction temperature is measured and stored in a memory for each stored output voltage measurement.

At S67, a determination is made as to whether additional input voltage values are to be used. If additional input voltage values are to be used, the method returns to S62. If additional input voltage values are not to be used, at S75, the temperature of the system 750 is brought to a high value. For example, the junction temperature of the system 750 may be brought to 100 C, 120 C, 140 C, or 160 C. Other temperature values may be used.

In some embodiments, the low or high temperature is set using at least one of: heating the electronic device in an oven, cooling the electronic device in a cooler, operating the electronic device in a power mode corresponding to the temperature to be set, sensing a temperature of the device, and adjusting the temperature based on the sensed temperature.

At S82, an input value is forced across conductor V_Dut and conductor DUT_Gnd. In response to the input value, the system 750 generates an output voltage measurement, as described above.

At S85, the output voltage measurement is stored in a memory.

In some embodiments, a junction temperature is measured and stored in a memory for each stored output voltage measurement. In such embodiments a temperature value for each temperature set at S55 and S75 is determined by taking the average of the junction temperatures stored for each temperature setting.

At S87, a determination is made as to whether additional input values are to be used. If additional input values are to be used, the method returns to S82. If additional input values are not to be used, at S95, compensation parameters for the compensation function are calculated.

In some embodiments, the compensation function is linear and the parameters for the compensation function include a gain and an offset. An output voltage measurement for each of two input voltages—high voltage (hv) and low voltage (lv)—may be stored in a memory for each of two temperatures—high temperature (ht) and low temperature (lt). Accordingly, four output voltage measurements are stored in a memory: high voltage/high temp (Vhvht), high voltage/low temp (Vhvlt), low voltage/high temp (Vlvht), and low voltage/low temp (Vlvlt). For each of the four output voltage measurements, an error voltage may be calculated: EVhvht=hv−Vhvht, EVhvlt=hv−Vhvlt, EVlvht=lv−Vlvht, and EVlvlt=lv−Vlvlt.

The gain parameter for the compensation function may be a normalized average of the difference in error voltages for the difference in temperatures, where the average is normalized for the difference in the high and low voltages. For example, the gain parameter may be calculated as follows: gain=[[[(EVhvht−EVhvlt)/(ht−lt)]+[(EVlvht−EVlvlt)/(ht−lt)]]/2]/(hv−lv).

The offset parameter for the compensation function may be a normalized average of the 0 degrees error voltage calculated based on each of the error voltages and the gain, where the average is normalized for the difference in the high and low voltages. For example, the offset parameter may be calculated as follows: offset=[[(EVhvht−gain*ht)+(EVhvlt−gain*lt)]/2]/(hv−lv).

Accordingly, given a measured voltage (Vm) at a temperature (T), using the compensation function, the processor 800 calculates a temperature compensated voltage (Vc) as follows: Vc=Vm*(offset+gain*T).

Alternative methods may be used for calibrating the system 750. For example, a higher order compensation function may be calculated and used, where parameters are calculated based on measurements at more than two temperatures using, for example, a curve fitting algorithm. In some embodiments, compensation parameters for compensation functions are calculated and used for different temperature domains or different output voltage domains. For example, a first compensation function may be used for voltage measurements which are less than 0 volts, and a second competition function may be calculated and used for voltage measurements are greater than 0 volts. Additionally or alternatively, a first compensation function may be used for temperatures which are less than 25 C, and a second competition function may be calculated and used for temperatures greater than 25 C.

Figure 26:
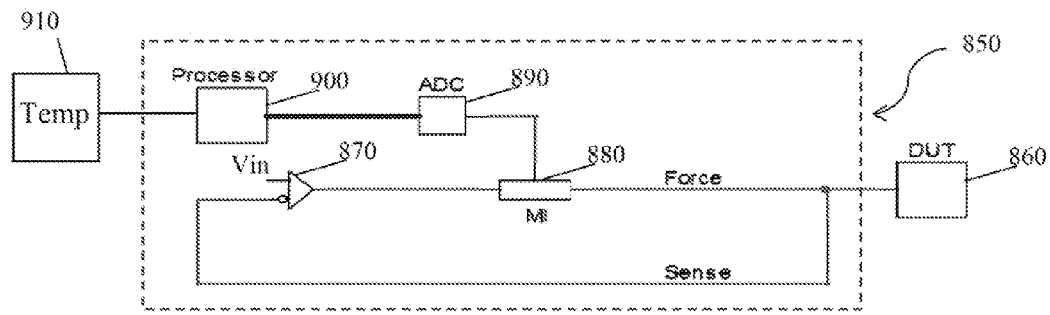
FIG. 26 is a block diagram of a measure current system which is configured to generate a voltage for a DUT.

FIG. 26 is a block diagram of a measure current system 850 which is configured to generate a voltage for DUT 860. Measure current system 850 may be used, for example, within an ATE system such as ATE system 150 of FIG. 7. For example, measure current system 850 or parts of measure current system 850 may be used in DPS 170 or PMU 190 of ATE system 150.

In this embodiment, measure current system 850 is configured to measure a current provided to DUT 860 while a voltage is being forced on conductor Force. In this embodiment, the voltage forced on conductor Force is substantially equal to the input voltage Vin, and is generated by difference amplifier 870. The current provided to DUT 860 by difference amplifier 870 is sensed by current measurement device 880, which provides an analog signal representing the current to ADC 890. ADC 890 provides a digital signal representing the current to processor 900. In some embodiments, current measurement device 880 includes a sense resistor such as resistor 510 discussed above.

In this embodiment, compensation for variation in the digital signal caused by temperature variation may be provided by processor 900. For example, processor 900 may be programmed with instructions which cause the processor 900 to calculate a compensated current value using a compensation function based on the digital value from the ADC 890 and based on a temperature value from temperature sensor 910. The compensation function has one or more compensation parameters which may be determined using a calibration method. In some embodiments, processor 900 is hardwired to perform the calculation, for example, as a fixed circuit. The compensated current value represents the measured current as compensated for temperature variation of the current measurement device 880. In some embodiments, the compensated current value represents the measured current as compensated for temperature variation of both the current measurement device 880 and the ADC 890. In some embodiments, compensation for temperature variation of the current measurement device 880 in the ADC 890 are separate.

Figure 27A:
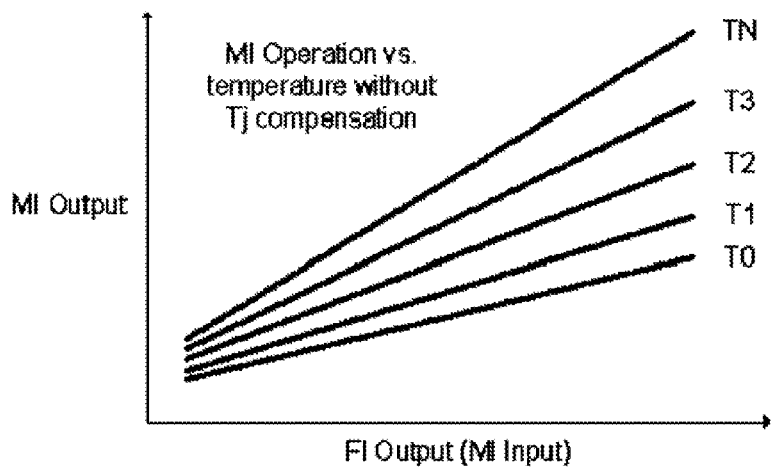
FIGS. 27A and 27B illustrate graphs showing the input/output characteristics of the measure current system for various temperatures T0-TN, where the compensation function has various values for one or more compensation parameters.
Figure 27B:
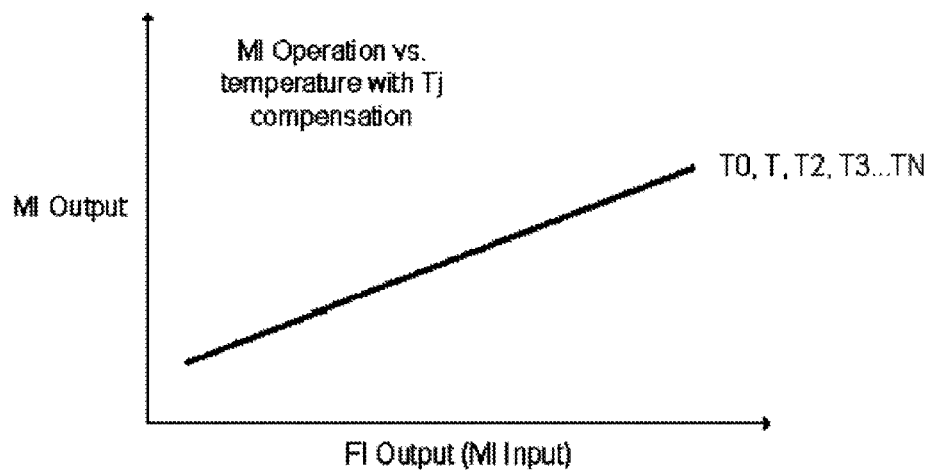

FIG. 27A illustrates a graph showing the input/output characteristics of measure current system 850 for various temperatures T0-TN, where the compensation function has first values for the one or more compensation parameters. As shown, the input/output characteristics of measure current system 850 vary significantly with temperature. FIG. 27B illustrates a graph showing the input/output characteristics of measure current system 850 for the temperatures T0-TN, where the compensation function has second values for the one or more compensation parameters. As shown, the input/output characteristics of system 850 do not significantly vary with temperature when the compensation parameters of the compensation function have the second values.

Figure 28:
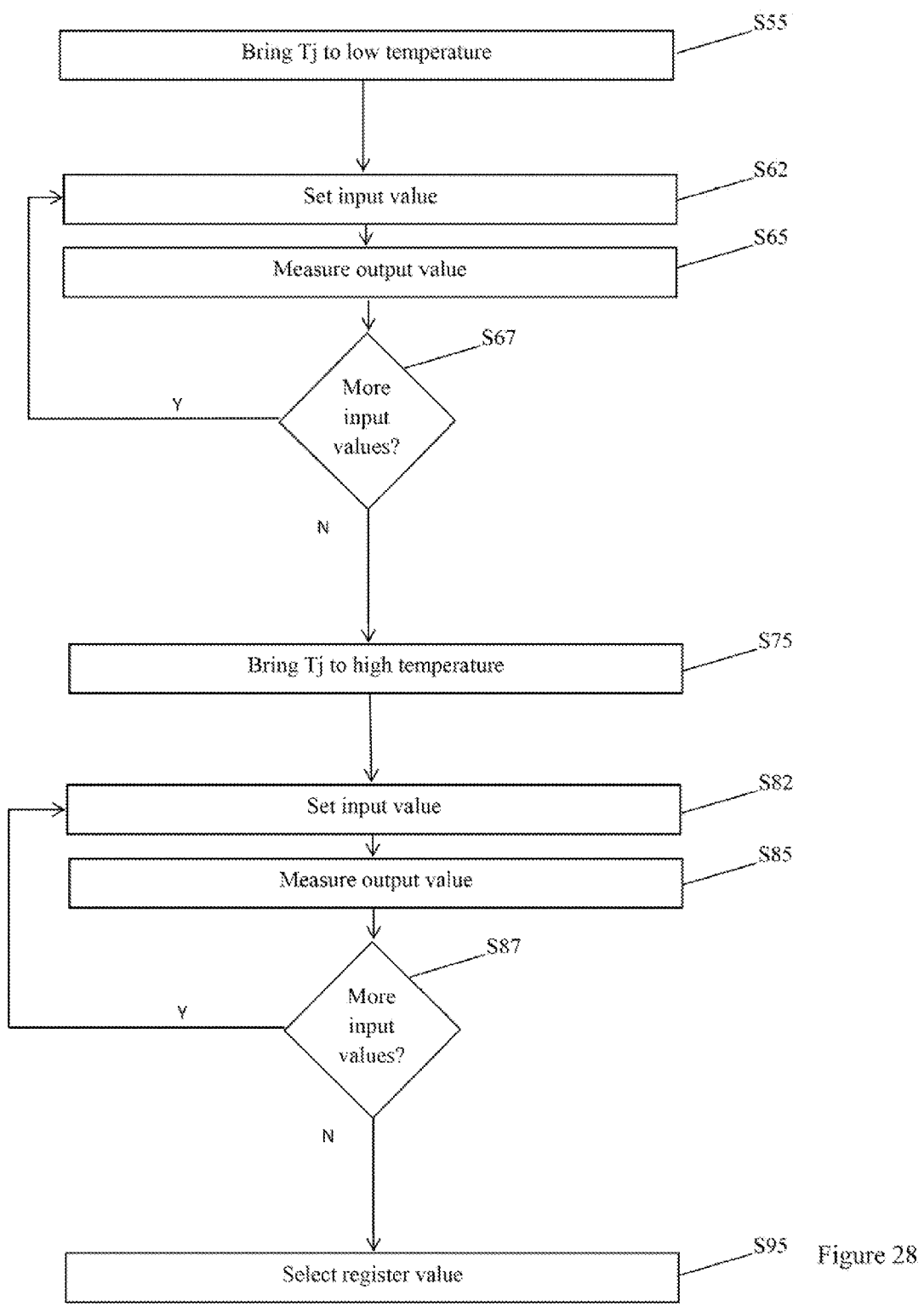
FIG. 28 is a flowchart diagram illustrating an embodiment of a method of calibrating the compensation function of the system of FIG. 26.

FIG. 28 is a flowchart diagram illustrating an embodiment of a method of calibrating the compensation function of system 850. Other methods of calibration may alternatively be used.

At S55, the temperature of the system 850 is brought to a low value. For example, the junction temperature of the system 850 may be brought to 0 C, −20 C, or −40 C. Other temperature values may be used.

At S62, the DUT 860 is caused to generate an input current value. For example, DUT 860 may be a resistor of a known value, and a voltage may be forced across the resistor to generate a known current input. In alternative embodiments, a DUT 860 is not used, and instead, a current source is connected to the Force/Sense node. In response to the input current value, with no compensation, the processor 900 generates an output current measurement.

At S65, the output current measurement is stored in a memory.

In some embodiments, a junction temperature is measured and stored in a memory for each stored output voltage measurement.

At S67, a determination is made as to whether additional input current values are to be used. If additional input voltage values are to be used, the method returns to S62. If additional input current values are not to be used, at S75, the temperature of the system 850 is brought to a high value. For example, the junction temperature of the system 850 may be brought to 100 C, 120 C, 140 C, or 160 C. Other temperature values may be used.

In some embodiments, the low or high temperature is set using at least one of: heating the electronic device in an oven, cooling the electronic device in a cooler, operating the electronic device in a power mode corresponding to the temperature to be set, sensing a temperature of the device, and adjusting the temperature based on the sensed temperature.

At S82, an input current value is generated. In response to the input value, the system 850 generates an output current measurement, as described above.

At S85, the output current measurement is stored in a memory.

In some embodiments, a junction temperature is measured and stored in a memory for each stored output voltage measurement. In such embodiments a temperature value for each temperature set at S55 and S75 is determined by taking the average of the junction temperatures stored for each temperature setting.

At S87, a determination is made as to whether additional input values are to be used. If additional input values are to be used, the method returns to S82. If additional input values are not to be used, at S95, compensation parameters for the compensation function are calculated.

In some embodiments, the compensation function is linear and the parameters for the compensation function include a gain and a slope. An output current measurement for each of two input currents—high current (hc) and low current (lc) may be stored for each of two temperatures—high temperature (ht) and low temperature (lt). Accordingly, four output current measurements are stored: high current/high temp (Ihcht), high current/low temp (Ihclt), low current/high temp (Ilcht), and low current/low temp (Ilclt). For each of the four output current measurements, an error current may be calculated: EIhcht=hc−Ihcht, EIhclt=hc−Ihclt, EIlcht=lc−Ilcht, and EIlclt=lc−Ilclt.

The gain parameter for the compensation function may be a normalized average of the difference in error currents for the difference in temperatures, where the average is normalized for the difference in the high and low currents. For example, the gain parameter may be calculated as follows: gain= [[[(EIhcht−EIhclt)/(ht−lt)]+[(EIlcht−EIlclt)/(ht−lt)]]/2]/(hc−lc).

The offset parameter for the compensation function may be a normalized average of the 0 degrees error current calculated based on each of the error currents and the gain, where the average is normalized for the difference in the high and low currents. For example, the offset parameter for the compensation function may be calculated as follows: offset=[[(EIhcht−gain*ht)+(EIhclt−gain*lt)]/2]/(hc−lc).

Accordingly, given a measured current (Im) at a temperature (T), using the compensation function, the processor 900 calculates a temperature compensated current (Ic) as follows: Ic=Im*(offset+gain*T).

In some embodiments, the current measurement device 880 includes a resistor, and the ADC 890 receives a voltage generated by the resistor, where the voltage is proportional to the current to be measured. In such embodiments, the parameters for the compensation function may include an effective resistance of the resistor, where the effective resistance is calculated based on the measurements of the method of FIG. 28 using Ohm's law.

In such embodiments, the gain parameter for the compensation function may be calculated as the average change in resistance experienced for the high and low temperatures divided by the difference between the high and low temperatures and normalized for the difference in the high and low currents. In such embodiments, the offset parameter for the compensation function may be calculated as the average resistance at the high temperature minus the gain times the high temperature and normalized for the difference in the high and low currents.

Alternative methods may be used for calibrating the system 850. For example, a higher order compensation function may be calculated and used, where parameters are calculated based on measurements at more than two temperatures using, for example, a curve fitting algorithm. In some embodiments, compensation functions are calculated and used for different temperature domains or different output current domains. For example, a first compensation function may be calculated and used for current measurements which are less than 0 amps, and a second competition function may be calculated and used for current measurements are greater than 0 amps.

The methods and actions described above may be performed by a computer system or a programmable device which accesses instructions for performing the methods and actions stored on a computer readable medium, such as a memory or another data storage device. The instructions, when executed by the computer system, cause the methods and actions to be performed. The instructions may be stored in a non-transitory computer readable medium, such as a memory or data storage device. The computer system, configured to perform or to be used to perform the methods and actions described above, accesses the instructions to perform the methods and actions.

The various aspects, processes, actions may be performed sequentially or in parallel. For example, a system capable of parallel processing may divide certain procedures among the available processing devices.

While various aspects, processes, actions, and systems have been described as being included in the embodiments discussed, the various aspects, processes, actions, and systems can be practiced with certain modifications. For example, the sequential order of the various aspects, processes, and actions may be modified. In addition, implementations having aspects of more than one embodiment may be practiced. Furthermore, implementations having certain aspects omitted may be practiced.

What is claimed is:

1. A method of programming an electronic device, the device comprising a circuit and a programmable reference signal generator, wherein the reference signal generator is configured to generate a reference signal based at least in part on a programmable code value and on a temperature, and wherein the circuit is configured to generate an output signal based at least in part on the reference signal, wherein at least one parameter of the output signal is dependent at least in part on the reference signal and on the temperature, the method comprising:

programming the reference signal generator with each of multiple code values;

setting the temperature to each of multiple temperature values;

measuring a value of the parameter for each of a plurality of combinations of the multiple code values and the multiple temperature values;

selecting a programming code value based on the measured parameter values; and programming the reference signal generator with the selected programming code value, wherein the circuit is configured to generate the output signal based in part on a received input value, and wherein the measuring comprises:

recording a first parameter value for a first programmed code value, a first input value, and a first temperature value, recording a second parameter value for the first programmed code value, the first input value, and a second temperature value, recording a third parameter value for the first programmed code value, a second input value, and the first temperature value, recording a fourth parameter value for the first programmed code value, the second input value, and the second temperature value, recording a fifth parameter value for a second programmed code value, the first input value, and the first temperature value, recording a sixth parameter value for the second programmed code value, the first input value, and the second temperature value, recording a seventh parameter value for the second programmed code value, the second input value, and the first temperature value, and recording an eighth parameter value for the second programmed code value, the second input value, and the second temperature value.

2. The method of claim 1, wherein a temperature dependence of the parameter is based at least in part on the programming code value, wherein the programming code value is selected from a plurality of code values each corresponding to one of a plurality of temperature dependences of the parameter, and wherein the selected code value corresponds with a minimum temperature dependence.

3. The method of claim 1, wherein setting the temperature comprises at least one of:
heating the electronic device in an oven;
cooling the electronic device in a cooler;
operating the electronic device in a power mode corresponding to the temperature to be set;
sensing a temperature of the device; and
adjusting the temperature based on the sensed temperature.

4. The method of claim 1, wherein the selecting comprises:
determining a first parameter temperature dependence for the first programmed code value based on the first, second, third, and fourth, recorded parameter values;
determining a second parameter temperature dependence for the second programmed code value based on the fifth, sixth, seventh, and eighth recorded parameter values; and
calculating a relationship between programmable code values and temperature dependence of the parameter based on the first and second parameter temperature dependences,
wherein selecting the programming code value comprises selecting the code value corresponding to a minimum temperature dependence of the parameter based on the relationship.

5. The method of claim 4, wherein:
determining the first parameter temperature dependence comprises averaging a temperature dependence determined based on the first and second recorded parameter values and a temperature dependence determined based on the third and fourth recorded parameter values; and
determining the second parameter temperature dependence comprises averaging a temperature dependence determined based on the fifth and sixth recorded parameter values and a temperature dependence determined based on the seventh and eighth recorded parameter values.

6. The method of claim 1, wherein programming the reference signal generator with each of multiple code values comprises programming a programmable register, and programming the reference signal generator with the selected programming code value comprises programming the programmable register.

7. The method of claim 6, wherein the reference signal generator comprises a programmable current source, configured to source a current dependent on the code value programmed in the programmable register.

8. The method of claim 6, wherein the reference signal generator comprises a current to voltage converter, configured to source a voltage dependent on the code value programmed in the programmable register.

9. The method of claim 1, wherein the reference signal generator comprises a bandgap voltage reference generator.

10. The method of claim 1, wherein measuring the value of the parameter comprises measuring an output voltage generated by the circuit.

11. The method of claim 1, wherein measuring the value of the parameter comprises measuring an output current generated by the circuit.

12. The method of claim 1, wherein measuring the value of the parameter comprises measuring a propagation delay generated by the circuit.

* * * * *